United States Patent [19]

Nakagawa et al.

[11] Patent Number: 5,072,287

[45] Date of Patent: Dec. 10, 1991

[54] SEMICONDUCTOR DEVICE AND METHOD OF MANUFACTURING THE SAME

[75] Inventors: Akio Nakagawa, Hiratsuka; Kazuyoshi Furukawa, Kawasaki; Tsuneo Ogura, Yokohama, all of Japan

[73] Assignee: Kabushiki Kaisha Toshiba, Kawasaki, Japan

[21] Appl. No.: 643,087

[22] Filed: Jan. 22, 1991

Related U.S. Application Data

[63] Continuation of Ser. No. 307,770, Feb. 8, 1989, abandoned.

[30] Foreign Application Priority Data

Feb. 8, 1988 [JP] Japan .................................. 63-26787
Sep. 30, 1988 [JP] Japan .................................. 63-246441

[51] Int. Cl.$^5$ ..................... H01L 27/04; H01L 27/02; H01L 27/12; H01L 21/302
[52] U.S. Cl. ........................................ 357/50; 357/43; 357/44; 357/49; 148/DIG. 12
[58] Field of Search ................. 357/49, 43, 44, 50; 148/DIG. 12

[56] References Cited

U.S. PATENT DOCUMENTS

| | | | |
|---|---|---|---|
| 4,286,280 | 8/1981 | Sugawara | 357/49 |
| 4,638,552 | 1/1987 | Shimbo et al. | 357/49 |
| 4,671,846 | 6/1987 | Shimbo et al. | 156/629 |
| 4,700,466 | 10/1987 | Nakagawa et al. | 437/247 |
| 4,710,794 | 12/1987 | Koshino et al. | 357/49 |
| 4,725,561 | 2/1988 | Haond et al. | 357/49 |
| 4,738,935 | 4/1988 | Shimbo et al. | 437/31 |
| 4,751,561 | 6/1988 | Jastrzebski | 357/43 |
| 4,791,465 | 12/1988 | Sakai et al. | 357/25 |
| 4,897,362 | 1/1990 | Delgado et al. | 437/26 |

FOREIGN PATENT DOCUMENTS 2832152 1/1979 Fed. Rep. of Germany ........ 357/49

OTHER PUBLICATIONS

IEEE Electron Device Letters, vol. EDL-8, No. 10, 1987, P454-456, A Dielectrically Isolated Photodiode Array by Silicon-Wafer Direct Bonding, J. Ohura et al.
IEDM Technical Digest, 1985, pp. 728-731, 350 V Analog-Digital Compatible Power IC Technologies, Y. Sugawara et al.

*Primary Examiner*—Rolf Hille
*Assistant Examiner*—Robert P. Limanek
*Attorney, Agent, or Firm*—Oblon, Spivak, McClelland, Maier & Neustadt

[57] ABSTRACT

A semiconductor device includes a semiconductor substrate, a pair of low breakdown voltage elements formed in the substrate so as to be adjacent to each other, and a high breakdown voltage element formed to be adjacent to one of the low breakdown voltage elements. The pair of low breakdown voltage elements are isolated from each other by a pn junction and the low breakdown voltage elements and the high breakdown voltage element are isolated from each other by a dielectric material. The semiconductor substrate is a composite substrate formed by directly bonding a first substrate serving as an element region to a second substrate serving as a supporting member through an insulating film.

17 Claims, 23 Drawing Sheets

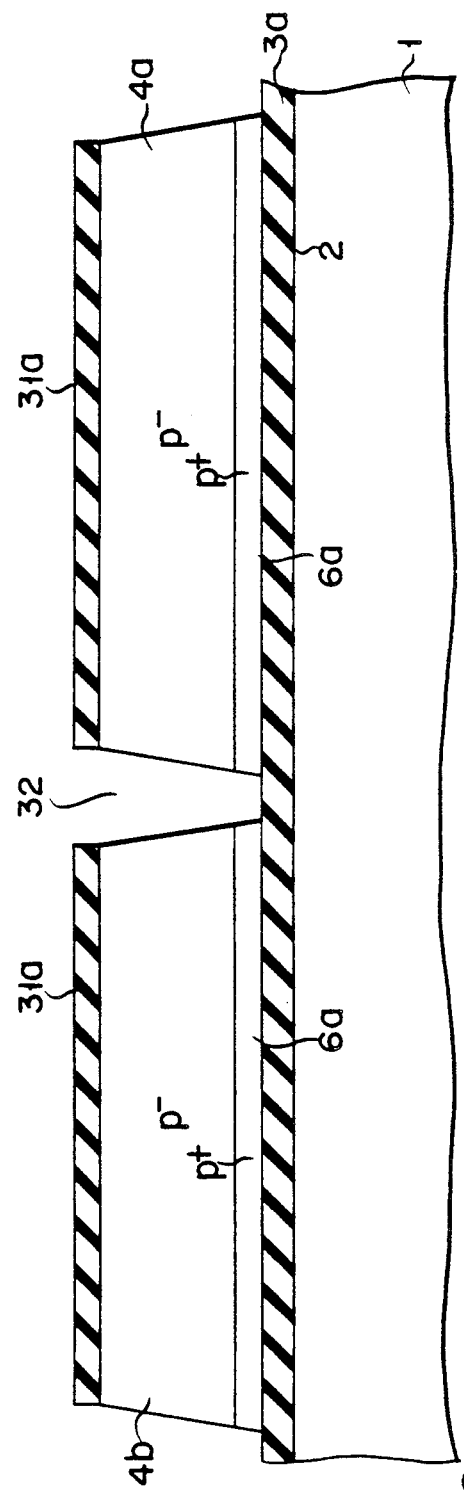
F.I.G. 2C
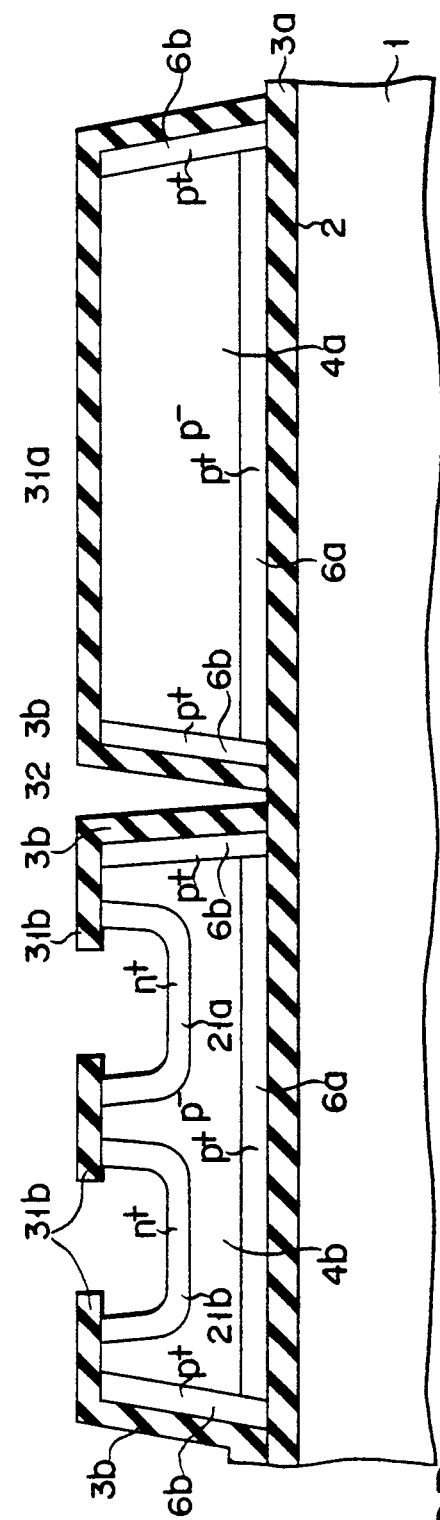
F.I.G. 2D

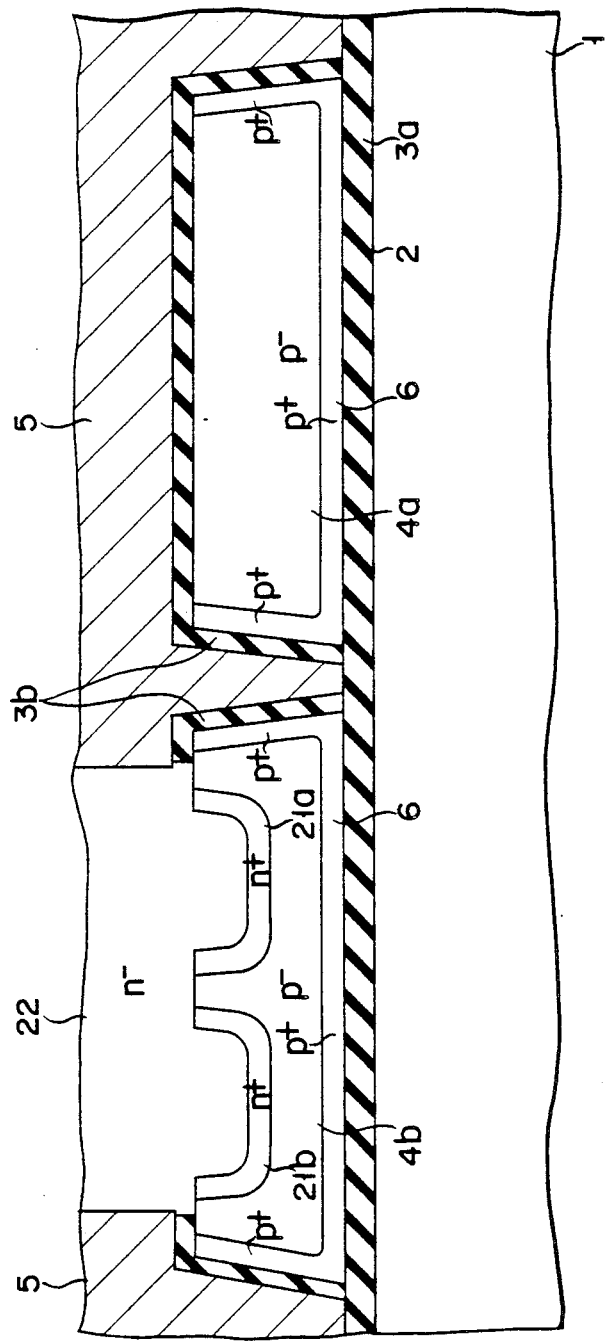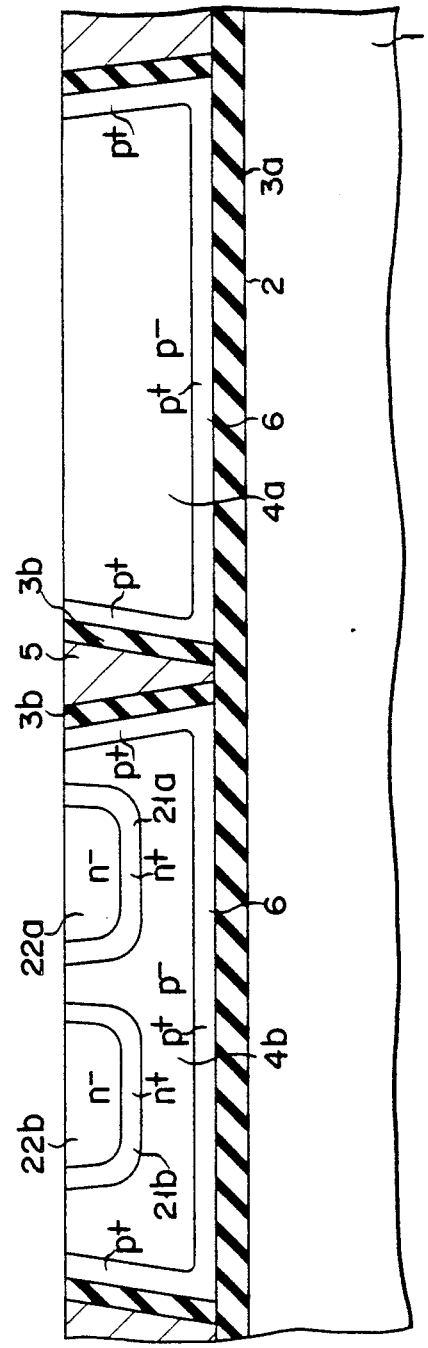
FIG. 2E
FIG. 2F

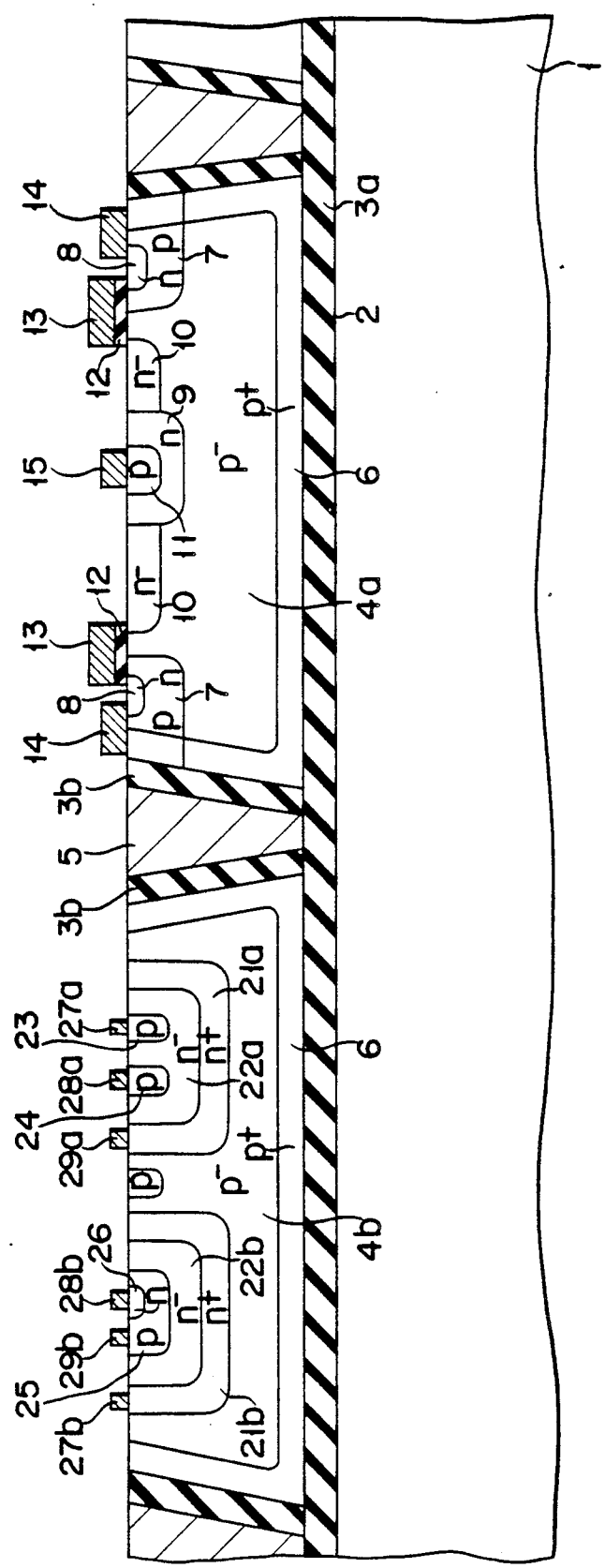
F I G. 2G

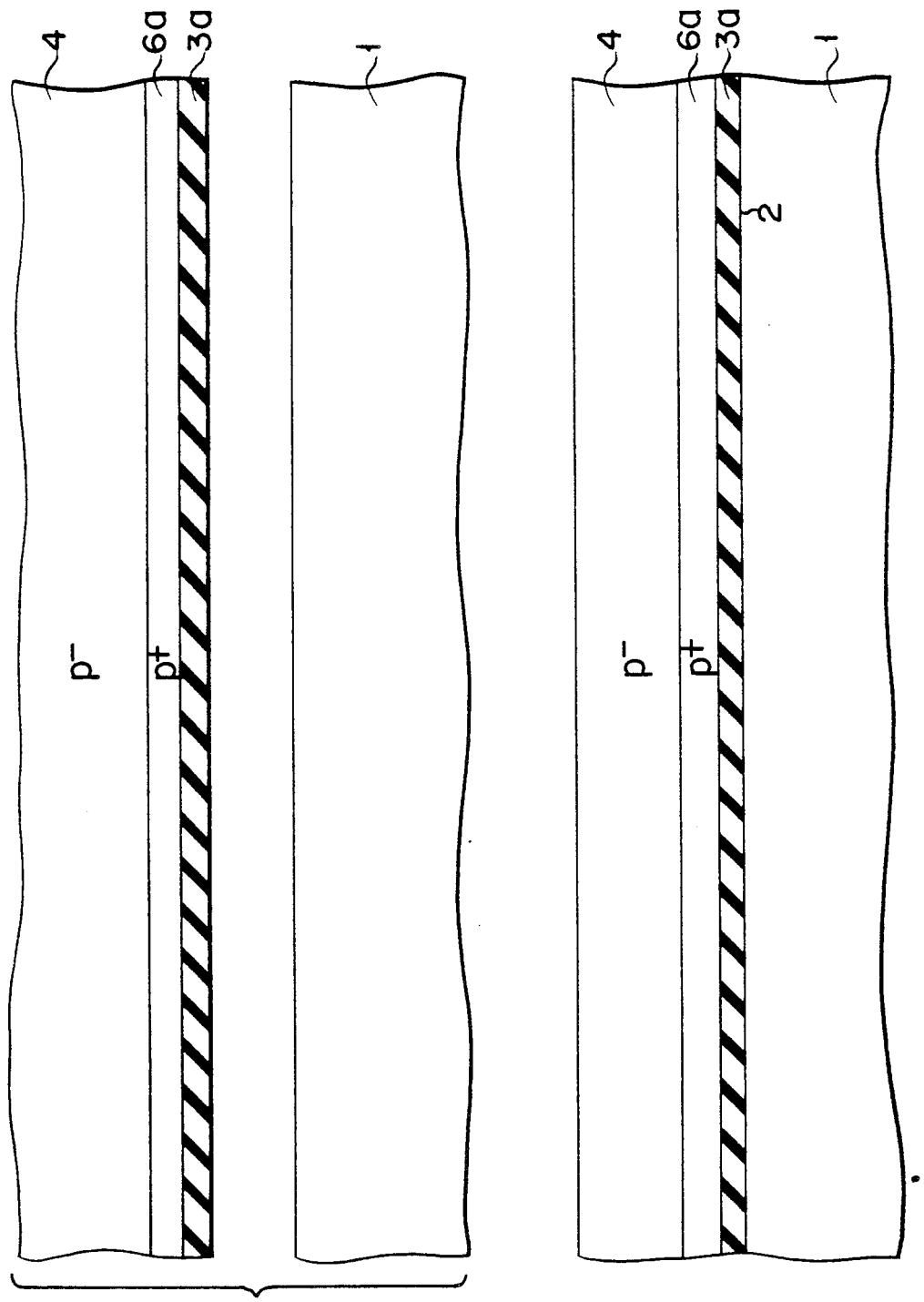

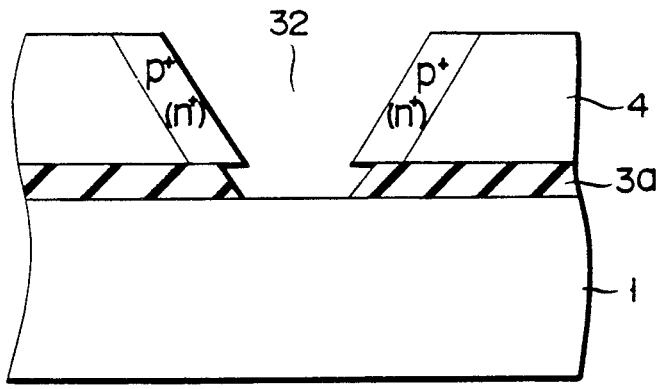
F I G. 15A
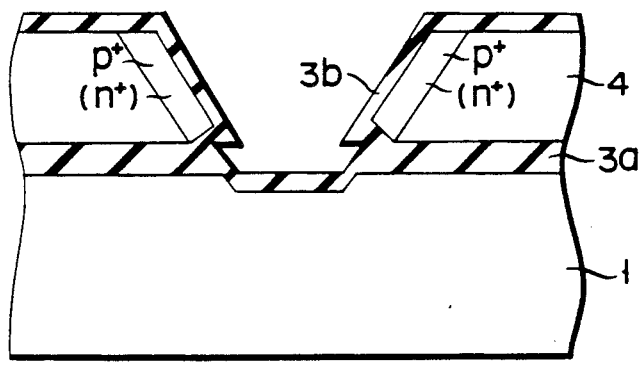
F I G. 15B
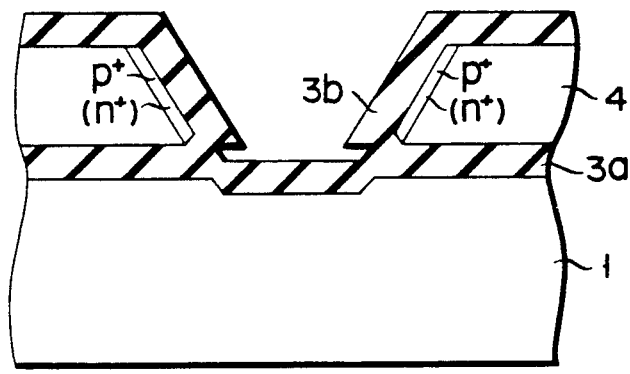
F I G. 15C

SEMICONDUCTOR DEVICE AND METHOD OF MANUFACTURING THE SAME

This application is a continuation of application Ser. No. 07/308,770, filed on Feb. 8, 1989, now abandoned.

BACKGROUND OF THE INVENTION

1. Field of the Invention

The present invention relates to a semiconductor device having a high breakdown voltage element and a low breakdown voltage element formed in a single substrate and a method of manufacturing the same.

2. Description of the Prior Art

Pn junction isolation and dielectric isolation are known as isolation techniques for semiconductor integrated circuits. Dielectric isolation is preferably employed to isolate a high breakdown voltage element used for large current switching from other elements so as to ensure reliable electrical isolation. When a high breakdown voltage element and a plurality of low breakdown voltage elements, such as bipolar transistors, constituting a control circuit for the high breakdown voltage element are integrated, dielectric isolation is preferably employed to prevent the low breakdown voltage elements from being electrically influenced by the high breakdown voltage element, e.g., prevent mixing of noise in the bipolar transistors due to large current switching. Generally, therefore, in a conventional integrated circuit using such dielectric isolation, a plurality of low breakdown voltage elements are respectively formed in different island regions isolated by a dielectric material in a substrate.

A structure wherein all the elements are isolated from each other by a dielectric material in such a manner is not preferable in terms of integration density, because dielectric isolation requires a larger area than pn junction isolation.

As described above, if the structure wherein all the elements are isolated by a dielectric material is employed in an integrated circuit having high and low breakdown voltage elements formed in a single substrate, an increase in integration density is limited.

SUMMARY OF THE INVENTION

It is an object of the present invention to provide a semiconductor device in which a decrease in integration density due to isolation is prevented when high and low breakdown voltage elements are integrally formed on a single substrate.

It is another object of the present invention to provide a method of manufacturing such a semiconductor device.

According to the present invention, there is provided a semiconductor device comprising a semiconductor substrate, a pair of low breakdown voltage elements formed on the substrate so as to be adjacent to each other, and a high breakdown voltage element formed to be adjacent to one of the low breakdown voltage elements, wherein the pair of low breakdown voltage elements are isolated from each other by a pn junction and the one of the low breakdown voltage elements and the high breakdown voltage element are isolated from each other by a dielectric material.

In the semiconductor device of the present invention, a composite substrate formed by directly bonding a first substrate serving as an element region a second substrate serving as a supporting member with an insulating film interposed therebetween can be used as the semiconductor substrate. In this case, of the composite substrate, the second substrate is of a first conductivity type having a low impurity concentration and is divided into a plurality of island regions which are isolated from each other by an isolating layer formed by burying a dielectric material in a trench. The high breakdown voltage element is formed in one island region, whereas the low breakdown voltage elements are formed in the other island region. The low breakdown voltage elements are isolated from each other by a pn junction.

In addition, according to the present invention, there is provided a method of manufacturing a semiconductor substrate comprising the steps of mirror-polishing one surface of each of first semiconductor substrate of a first conductivity type and second semiconductor substrate, forming a first impurity region of the first conductivity type in the mirror-polished surface of the first semiconductor substrate, forming a first insulating film on at least one of a surface of the first impurity region and the mirror-polished surface of the second semiconductor substrate, forming a composite substrate by directly bonding the mirror-polished surface of the first semiconductor substrate to the mirror-polished surface of the second substrate, forming at least one groove by selectively etching a portion of the first semiconductor substrate of the composite substrate, forming second impurity regions by diffusing an impurity in side walls of a plurality of semiconductor layers which are isolated from each other by the groove, forming a second insulating film in surfaces of the second impurity regions, forming a high breakdown voltage element in one of the semiconductor layers, and forming a plurality of low breakdown voltage elements which are isolated from each other by a pn junction in the other one of the semiconductor layers.

Furthermore, according to the present invention, there is provided a method of manufacturing a semiconductor substrate comprising the steps of mirror-polishing one surface of each of first semiconductor substrate of a first conductivity type and second semiconductor substrate, forming a first impurity region of the first conductivity type in the mirror-polished surface of the first semiconductor substrate, forming a first insulating film on at least one of a surface of the first impurity region and the mirror-polished surface of the second semiconductor substrate, forming a composite substrate by directly bonding the mirror-polished surface of the first semiconductor substrate to the mirror-polished surface of the second substrate, forming a first groove which reaches the insulating film and a plurality of second grooves which do not reach the first impurity region by selectively etching a portion of the first semiconductor substrate of the composite substrate, the first substrate being divided into a first semiconductor region and a second semiconductor region having the second trench which are isolated from each other by the first trench, forming second impurity region by diffusing an impurity in side walls of the first trench, forming a second insulating film on a surface of the second impurity region in the first groove, burying a dielectric material and semiconductor material layer in the first groove and the second grooves, respectively, forming a high breakdown voltage element in the first semiconductor region, and forming low breakdown voltage element which are isolated from each other by a pn junction in the semiconductor material layers.

BRIEF DESCRIPTION OF THE DRAWINGS

FIGS. 2A to 2G are sectional views showing the steps in manufacturing the semiconductor device in FIG. 1;

FIGS. 12A to 12G are sectional views showing the steps in manufacturing the semiconductor device in FIG. 11;

FIGS. 15A to 15C are sectional views for explaining a modification of the present invention.

DETAILED DESCRIPTION OF THE PREFERRED EMBODIMENTS

Preferred embodiments will be described below with reference to the accompanying drawings.

Figure 1:
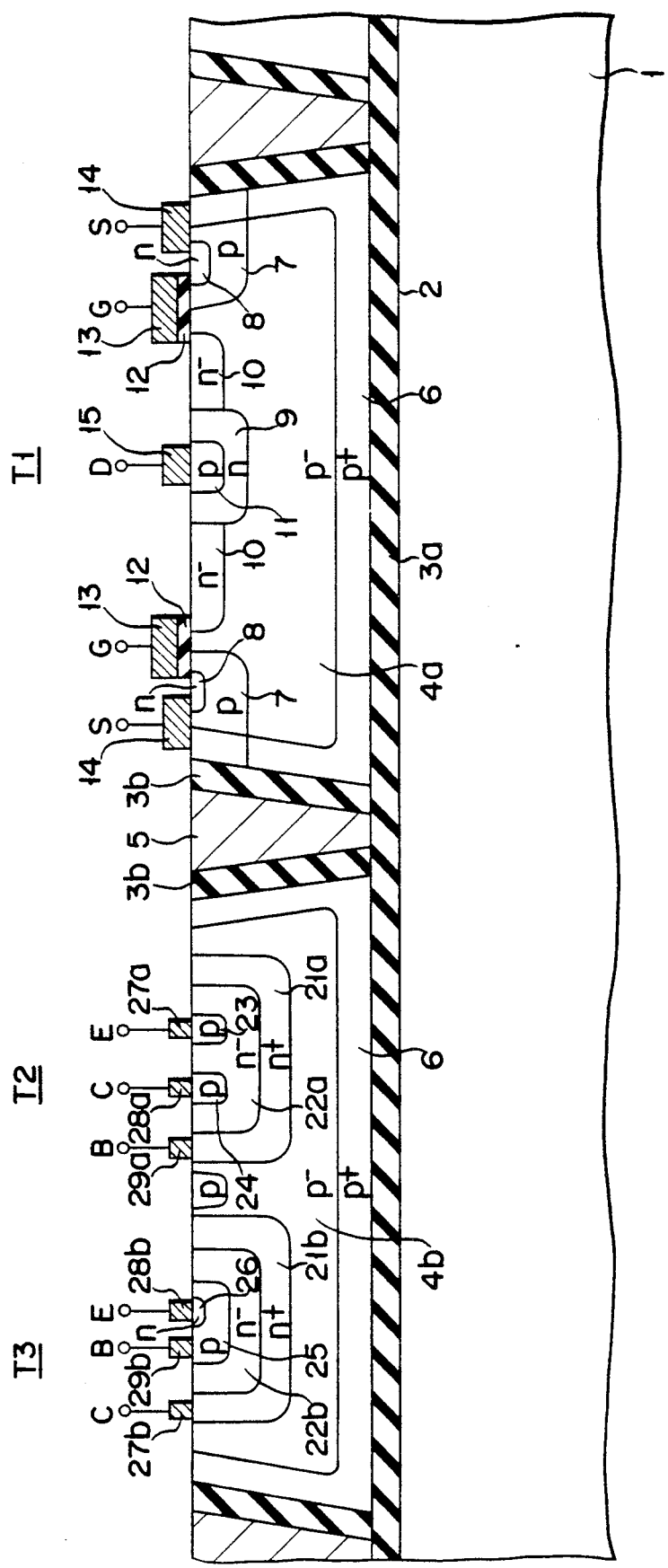
FIG. 1 is a sectional view of a semiconductor device according to one embodiment of the present invention.

FIG. 1 is a sectional view of a semiconductor device according to an embodiment of the present invention. In this semiconductor device, lateral insulated gate bipolar transistor (IGBT) T1 as a high breakdown voltage element, and a plurality of bipolar transistors (FIG. 1 shows two transistors, i.e., pnp and npn transistors T2 and T3) as a plurality of low breakdown voltage elements used for a control circuit of transistor T1 are integrally formed. More specifically, a plurality of p⁻-type Si layers 4a and 4b which are isolated from each other in islands formed by $SiO_2$ layers 3a and 3b are formed in Si substrate 4 on Si substrate 1. IGBT T1 is formed in one Si layer, i.e. layer 4a, whereas pnp and npn transistors T2 and T3 which are isolated from each other by pn junction isolation are formed in the other Si layer, i.e., layer 4b. This process will be described in detail in accordance with practical manufacturing steps.

Figure 2A:
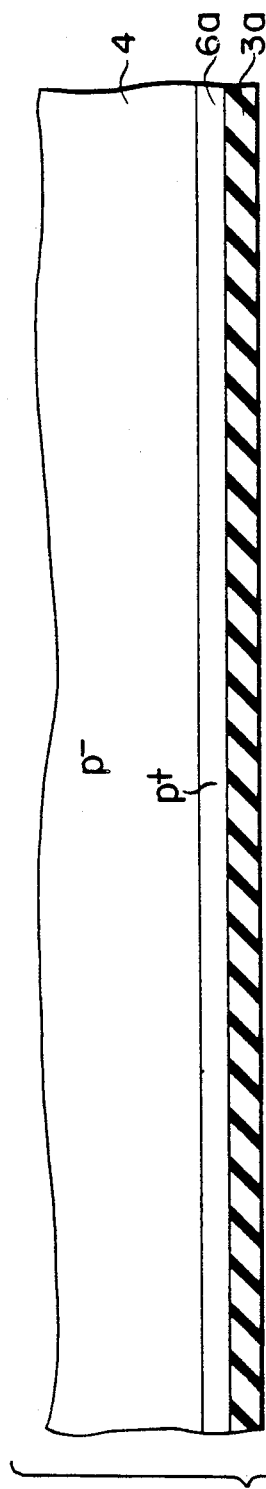
Figure 2B:
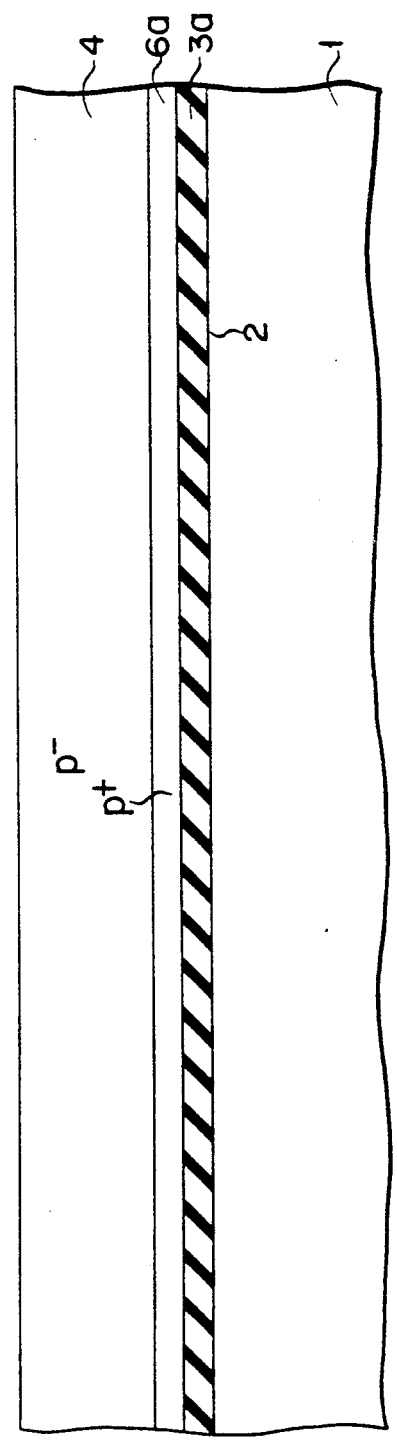

FIGS. 2A to 2G show the manufacturing steps. First, two Si substrates 1 and 4 are prepared. One surface of each of Si substrates is mirror-polished. One substrate, i.e., Si substrate (first semiconductor substrate) 4 is a p⁻-type substrate for element formation, and has a resistivity of 70 to 100 Ω·cm. After p⁺-type layer 6a is formed in the mirror-polished surface of substrate 4 by diffusing boron at a high concentration, $SiO_2$ film 3a having a thickness of about 1 μm is formed on the surface of the resultant structure. The other substrate, i.e., Si substrate (second semiconductor substrate) 1 may be of p- or n-type, and has no limitation as to specific resistivity. Such two substrates 1 and 4 are bonded to each other by a silicon wafer direct-bonding technique. Then, a surface of substrate 4, which is opposite to the bonding surface, is polished to obtain p⁻-type Si layer 4 having a thickness of about 60 μm (FIG. 2B). $SiO_2$ film 3a is used for element isolation. It has been confirmed from experiments performed by the present inventors that in order to reduce warpage of the resultant wafer, $SiO_2$ film 3a must be formed on element formation substrate 4 in advance, and that bonding interface 2 must face the upper surface of $SiO_2$ film 3a which is formed on element formation substrate 4 in advance.

The steps of practical direct bonding are performed in the following manner. Substrates to be bonded are cleaned by an $H_2SO_4$—$H_2O_2$ mixture solution, HCl—$H_2O_2$ mixture solution, aqua regia, or the like. Subsequently, the substrates are cleaned by water for about ten minutes, and are dried by a spin dryer or the like. The substrates subjected to these processes are set in a clean atmosphere below, e.g., class 100, and their mirror-polished surfaces are bonded to each other in a state wherein substantially no contaminant is present therebetween. With this process, the two substrates are bonded to each other with a certain strength. When the substrates bonded to each other in this manner are subjected to heat-treatment in a diffusion furnace or the like, bonding strength is increased, and the two substrates are completely bonded. An increase in bonding strength is observed at about 200° C. or more, preferably at 800° to 1200° C. No special attention need be paid to the atmosphere for the heat-treatment process. For example, heat-treatment can be performed in an oxygen, nitrogen, hydrogen, inert gas, steam, or a gas mixture thereof. In the embodiment, cleaning was performed by an $H_2SO_4$—$H_2O_2$ mixture solution and an HCl—$H_2O_2$ mixture solution, and heat-treatment was performed a nitrogen atmosphere including a small amount of oxygen at 1,100° C. for two hours.

Subsequently, the surface of Si substrate 4 is lapped and polished to reduce the thickness. And, $SiO_2$ film 31 is formed on the upper surface of Si substrate 4. Tapered isolation trench 32 is then formed by etching, e.g., anisotropic etching Si layer 4 to a depth reaching $SiO_2$ film 3a using pattern 31a obtained by patterning $SiO_2$ film 31 as a mask. With this process, Si layers 4a and 4b are isolated in the forms of islands (FIG. 2C). Boron is diffused in isolation trench 32 by diffusion so as to form p⁺-type layers 6b in the side walls of island Si layers 4a and 4b. P⁺-type layers 6b are integrated with p⁺-type layer 6a on the bottom of the isolation trench so as to constitute p⁺-type layer 6. $SiO_2$ film 3b is formed in the side wall of each Si layer 4 by another thermal oxidation of the side wall. Then, $SiO_2$ film 31 on the surface of Si layer 4b on the low breakdown voltage element side is patterned to form pattern 31a. Si layer 4 is etched by using pattern 31a as an etching mask to form recesses in the element region. Phosphorus or antimony is introduced in the recesses at a high concentration by diffusion to form n⁺-type layers 21a and 21b (FIG. 2D).

Subsequently, $SiO_2$ film 31b on the surface of Si layer 4b in which the recesses are formed is removed, and epitaxial growth of Si is performed to form high-resistance n⁻-type layer 22. At the same time, polysilicon layer 5 is formed on $SiO_2$ film 31a on the isolation region covered with $SiO_2$ film 3b and on the other Si layer, i.e., layer 4a (FIG. 2E). The growth layer surface is then lapped and polished so that the thickness of substrate 4 is 20 to 100 μm, and n⁻-type layers 22a and $22b$ are buried in the recesses to obtain a flat state wherein polysilicon film 5 is buried in the isolation trench (FIG. 2F). Since $n^-$-type layer 22 is buried only in the recesses and other portions thereof are removed, only portions of $SiO_2$ film $31b$ overhanging in the recesses need be theoretically removed when the epitaxial growth process in FIG. 2E is performed. However, if crystal growth is performed while $SiO_2$ film $31b$ is locally left, a high-quality single crystal cannot be buried, and hence defects are often caused. In order to decrease the defects, $SiO_2$ film $31b$ on the surface of Si layer $4b$ is preferably removed substantially entirely in crystal growth, as described above.

Pnp transistor T2 and npn transistor T3 which are isolated from each other by a pn junction isolation are respectively formed in $n^-$-type layers $22a$ and $22b$ buried in this manner.

More specifically, p-type layers 23 and 24 are formed in the surface region of $n^-$-type $22a$ at a predetermined interval. Thereafter, collector, emitter, and base electrodes $27a$, $28a$, and $29a$ are formed. As a result, lateral type pnp transistor T2 having $n^-$-type layer $22a$ serving as a base, and p-type layers 23 and 24 respectively serving as a collector and a emitter is formed.

p-type layer 25 is formed in the surface region of n-type layer $22b$ by impurity diffusion. In addition, n-type layer 26 is formed in the surface region of p-type layer 25. Then, collector, emitter, and base electrodes $27b$, $28b$, and $29b$ are formed to form vertical type npn transistor T3 having $n^-$-type layer $22b$ as a collector, p-type layer 26 as a base, and n-type layer 26 as an emitter.

Subsequently, in $p^-$-type Si layer $4a$, p-type base layer 7 is formed in its peripheral portion, n-type source layer 8 is formed therein, n-type base layer 9 is formed in its central portion, and p-type drain layer 11 is formed therein by impurity diffusion. $N^-$-type layer 10 serving as a guard ring is formed around n-type base layer 11 by impurity diffusion. Gate electrode 13 is formed on a region between n-type source layer 8 and $n^-$-type layer 10 with gate insulating film 12 interposed therebetween. Then, drain electrode 15 is formed on p-type drain layer 11, and source electrode 14 is formed on n-type source layer 8 and p-type base layer 7 so as to be simultaneously in contact with layers 8 and 7, thereby obtaining IGBT-T1 (FIG. 2G).

In the semiconductor device obtained in the above-described manner, high breakdown voltage IGBT-T1 processing a large current can be electrically isolated from low breakdown voltage transistors T2 and T3 operated by a small current with high reliability by a dielectric material. On the other hand, since transistors T2 and T3 are isolated from each other by a pn junction isolation, an extra area for element isolation is not required. Therefore, a high integration density can be realized. In the above embodiment, two bipolar transistors are integrated as low breakdown voltage elements. The present invention, however, exhibits a noticeable effect in terms of integration density especially when a large number of low breakdown voltage elements are integrated. Furthermore, in the above embodiment, high-concentration $p^+$-type layers 6 are formed on the oxide film interfaces of the bottom and side walls of the $p^-$-type layers isolated in the forms of islands, thereby obtaining high reliability. More specifically, many defects are normally present in an oxide film interface. If a depletion layer extending from an element formed in the device reaches this interface, leak, a decrease in breakdown voltage, or the like may be caused. However, formation of $p^+$-type layers 6 can prevent the depletion layer from reaching the interface.

Note that in the above embodiment, only one IGBT serving as a high breakdown voltage element is exemplified. However, a plurality of such elements may be integrally formed. In this case, the high breakdown voltage elements preferably have a dielectric isolation structure.

The present invention is not limited to the above embodiment. Other embodiments will be described below. The same reference numerals in the drawings of the following embodiments denote the same parts as in the drawings of the previous embodiment, and a detailed description thereof will be omitted.

Figure 3:
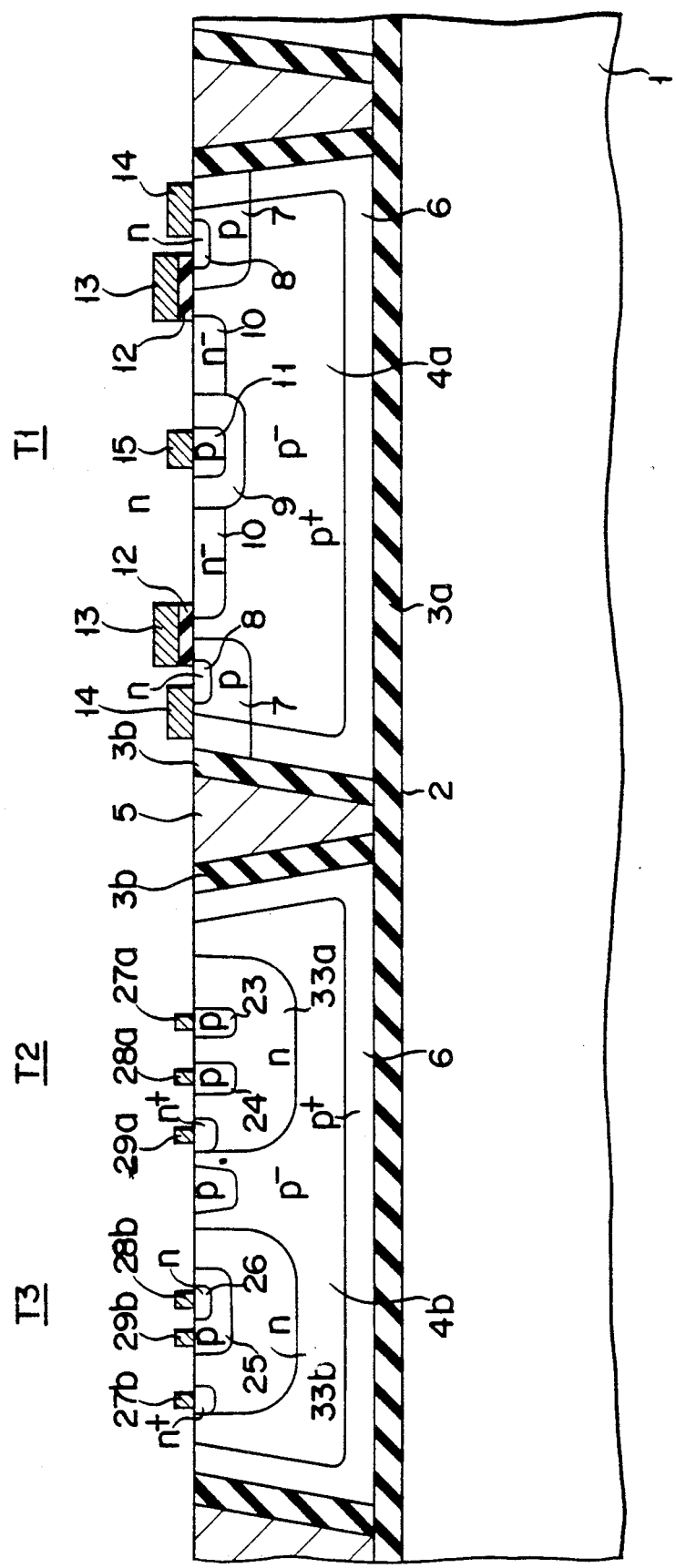
FIG. 3 is a sectional view of a semiconductor device in which a formation region of low breakdown voltage elements is formed by impurity diffusion.

FIG. 3 shows an embodiment wherein transistors T2 and T3 in FIG. 1 are modified. In this embodiment, n-type layers $33a$ and $33b$ respectively serving as a base layer and a collector layer of each of transistors T2 and T3 are formed by impurity diffusion.

According to this embodiment, since a low-resistance $n^+$-type buried layer such as shown in the previous embodiment is not formed, transistor characteristics are slightly inferior to those in the previous embodiment. However, since the steps of forming the recesses, crystal growth, etching, and the like upon formation of the dielectric isolation structure are omitted, the overall steps can be greatly simplified, thereby decreasing the manufacturing cost.

Figure 4:
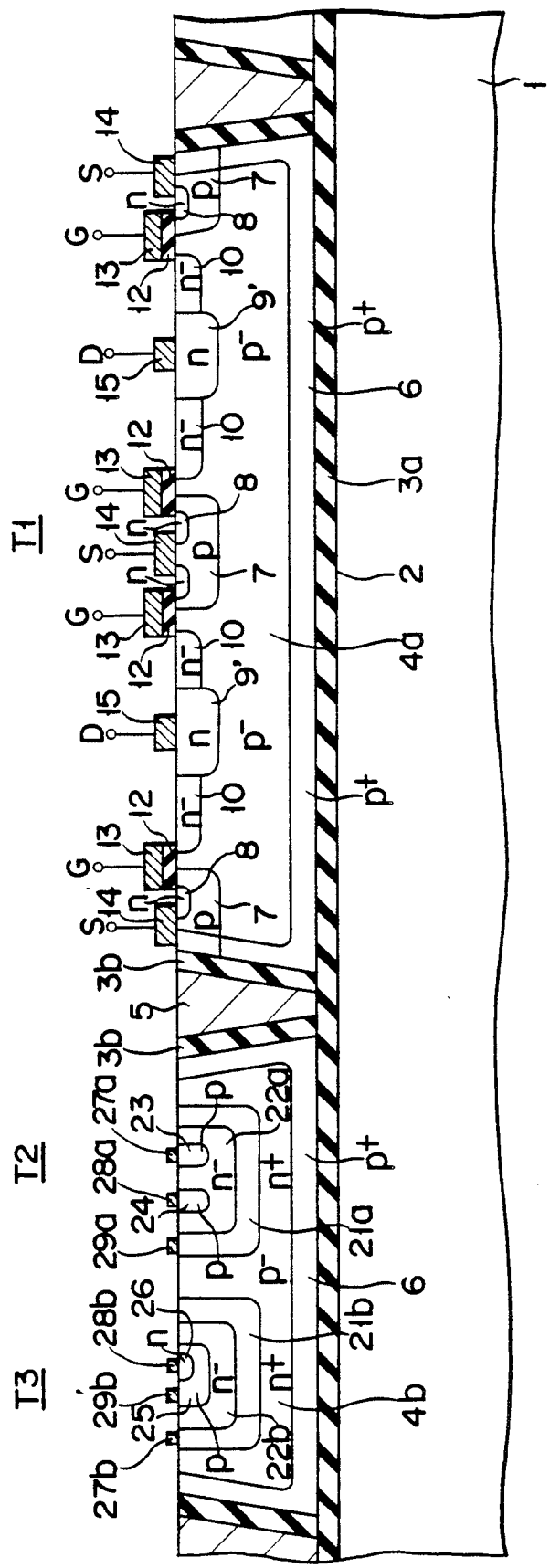
FIG. 4 is a sectional view of a semiconductor device in which a lateral MOSFET is used as a high breakdown voltage element.

FIG. 4 shows an embodiment wherein lateral type MOSFET-T1 is used in place of IGBT-T1. In this embodiment, n-type layer 9, is a drain layer, and drain electrode 15 is in direct contact therewith. Unlike IGBT-T1 in the embodiment of FIG. 1, MOSFET-T1 is not bipolar-operated but is unipolar-operated by ON/OFF control of a channel formed on its surface. In this embodiment, even when a plurality of identical lateral type MOSFETs are integrally formed, no specific element isolation is required between them.

Figure 5A:
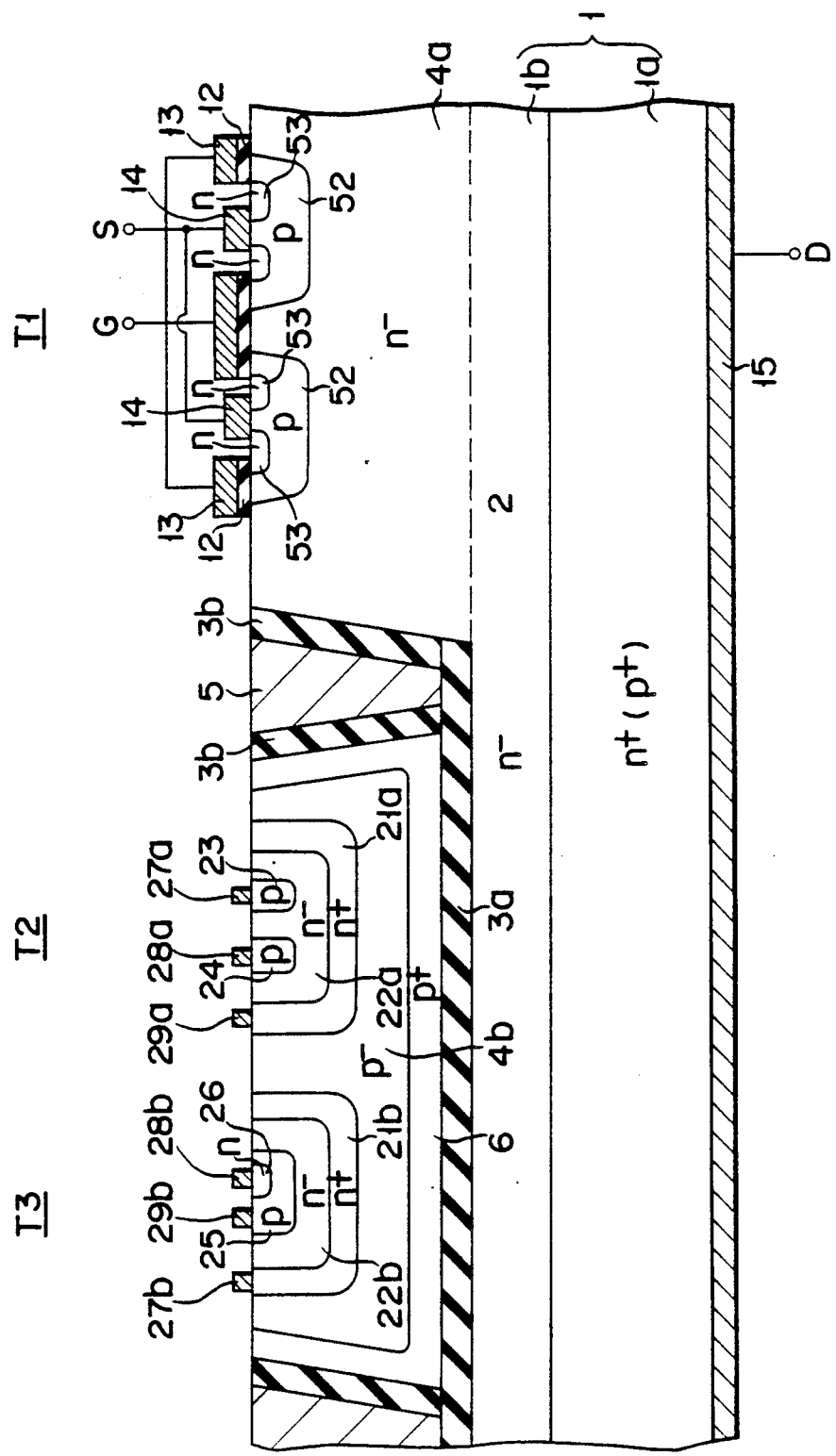
FIG. 5A to 5C are sectional views of semiconductor devices in which a vertical type device is used as a high breakdown voltage element.

FIG. 5A shows an embodiment wherein vertical type MOSFET-T1 is used in place of IGBT-T1 in FIG. 1. In this case, substrate 1 has a double-layer structure consisting of $n^+$- and $n^-$-type layers $1a$ and $1b$, and no $SiO_2$ film is formed on bonding interface 2 in the region of MOSFET-T1. P-type base layer 52 is formed in a surface portion of $n^-$-type layer $41a$, n-type source layer 53 is formed therein, and $n^+$-type layer $1a$ is formed as a drain, thereby forming vertical type MOSFET-T1.

In FIG. 5A, $n^+$-type layer 1a can be replaced with $p^+$-type layer. In this case, element T1 may be a MOS thyristor or IGBT.

Figure 5B:
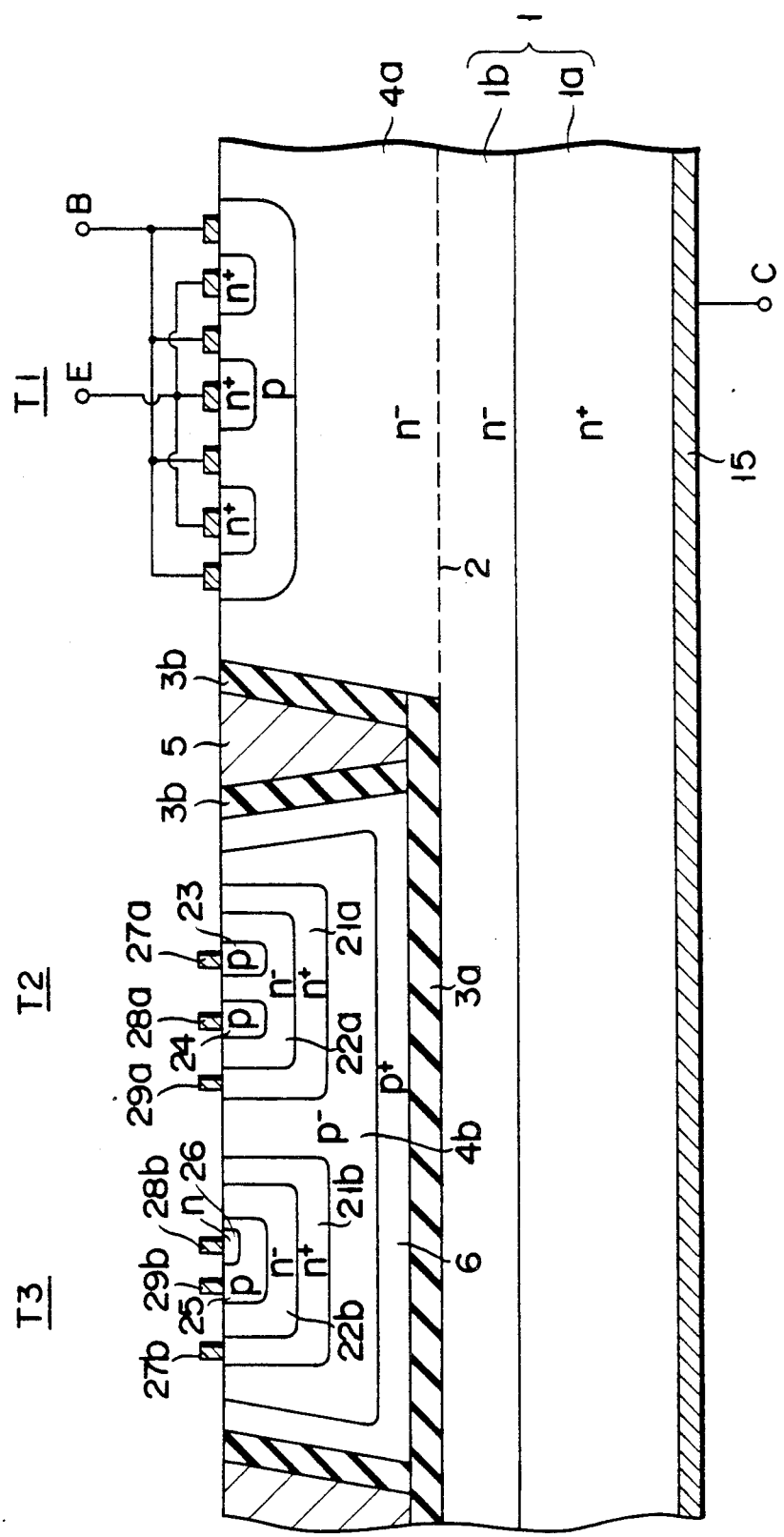

FIG. 5B shows an embodiment wherein npn transistor T1 is used in place of vertical type MOSFET-T1 in FIG. 5A. Npn transistor can be used in place of npn transistor.

Figure 5C:
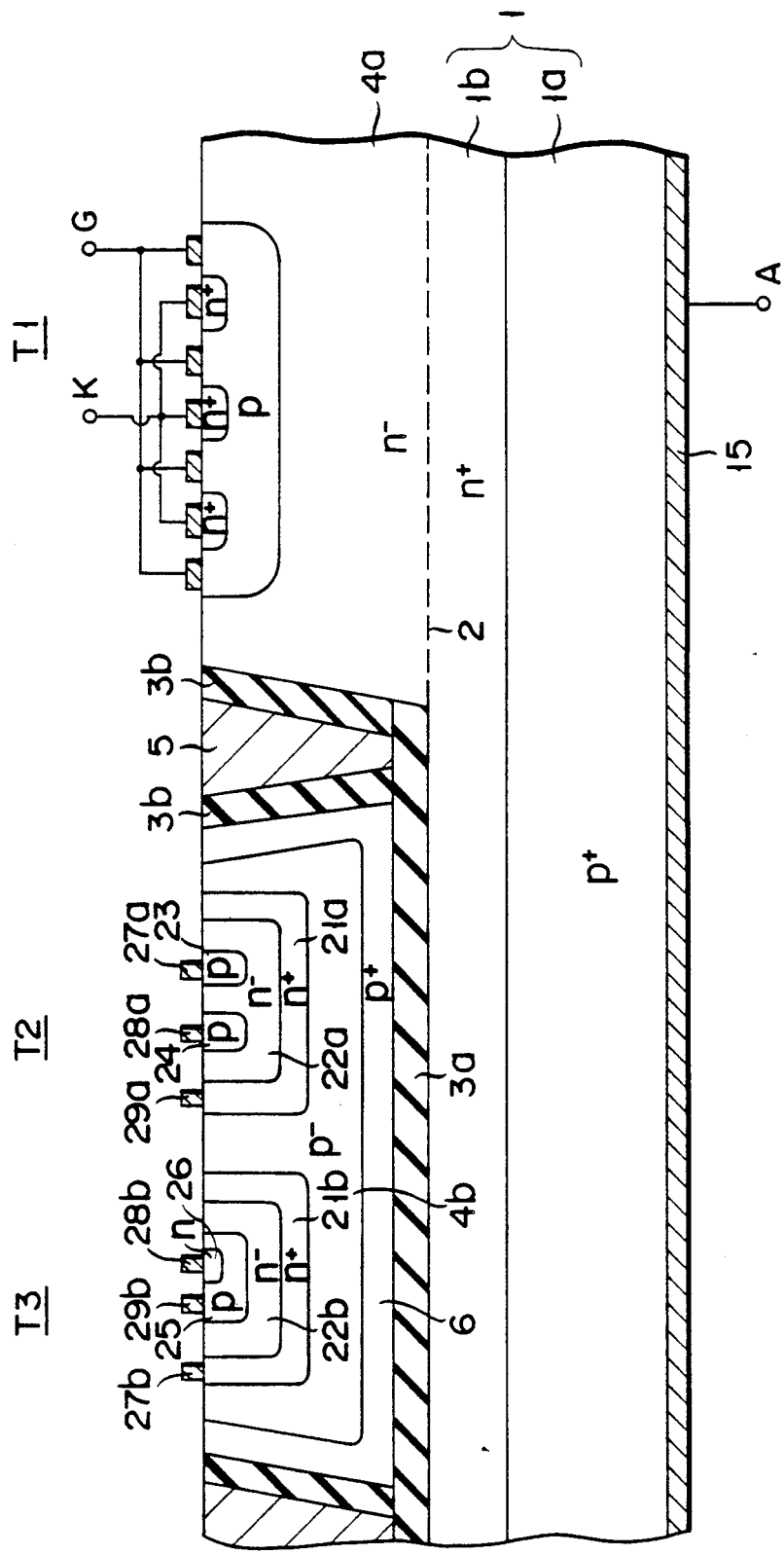

FIG. 5C shows an embodiment wherein GTO (gate turn-off thyristor) is used in place of vertical type MOSFET-T1 in FIG. 5A. Thyristor or MOSGTO can be used in place of GTO.

In these embodiments shown in FIGS. 5A to 5C, the same effects as in the previous embodiment can be obtained.

Figure 6:
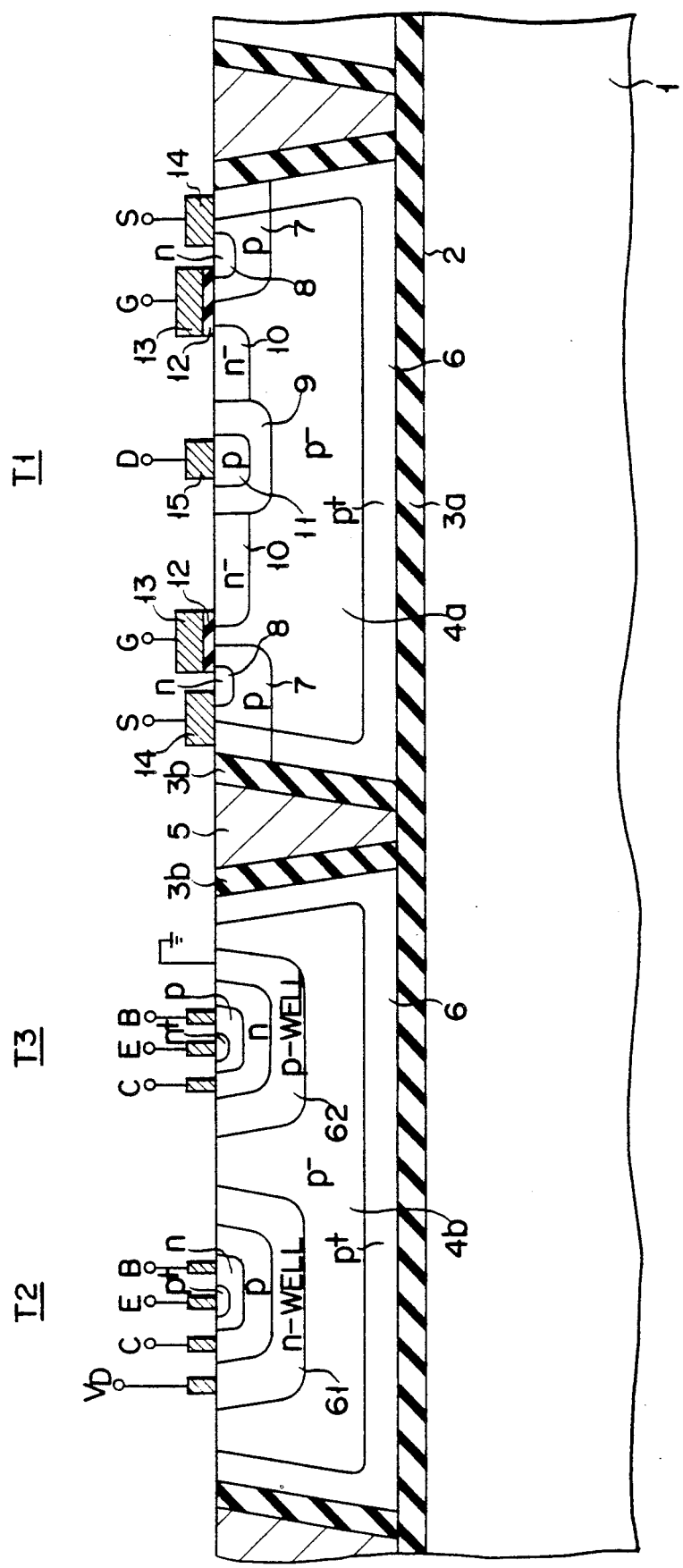
FIGS. 6 to 9 are sectional views of semiconductor devices in which an arrangement of low breakdown voltage elements is variously changed.
Figure 7:
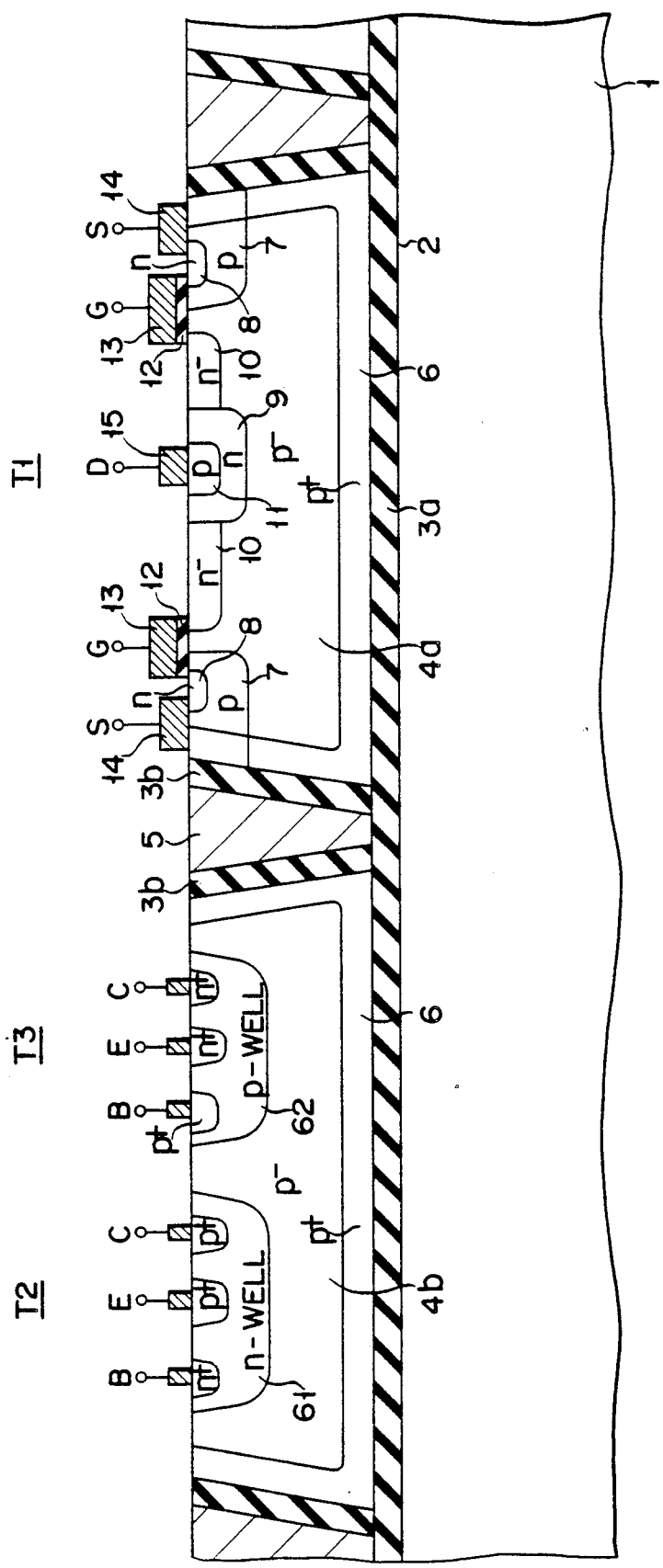
Figure 8:
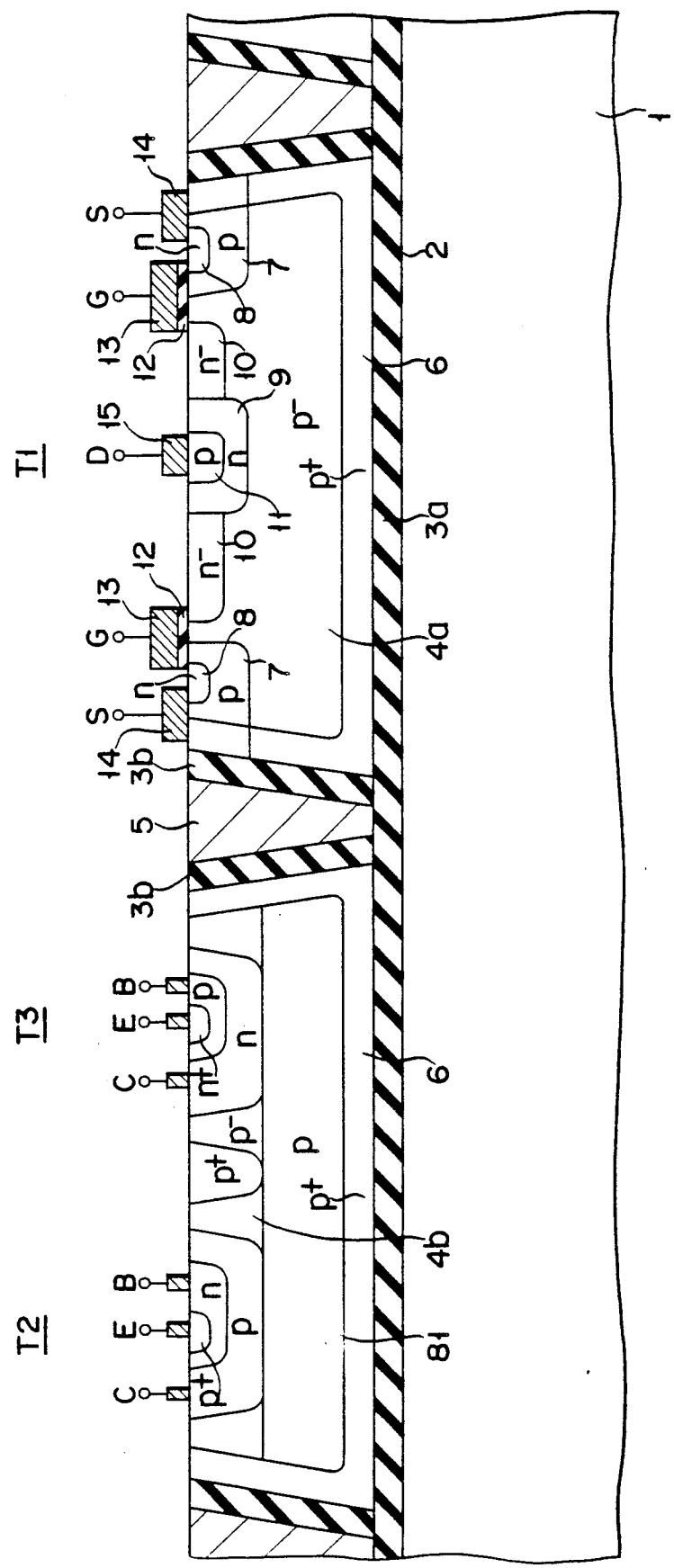
Figure 9:
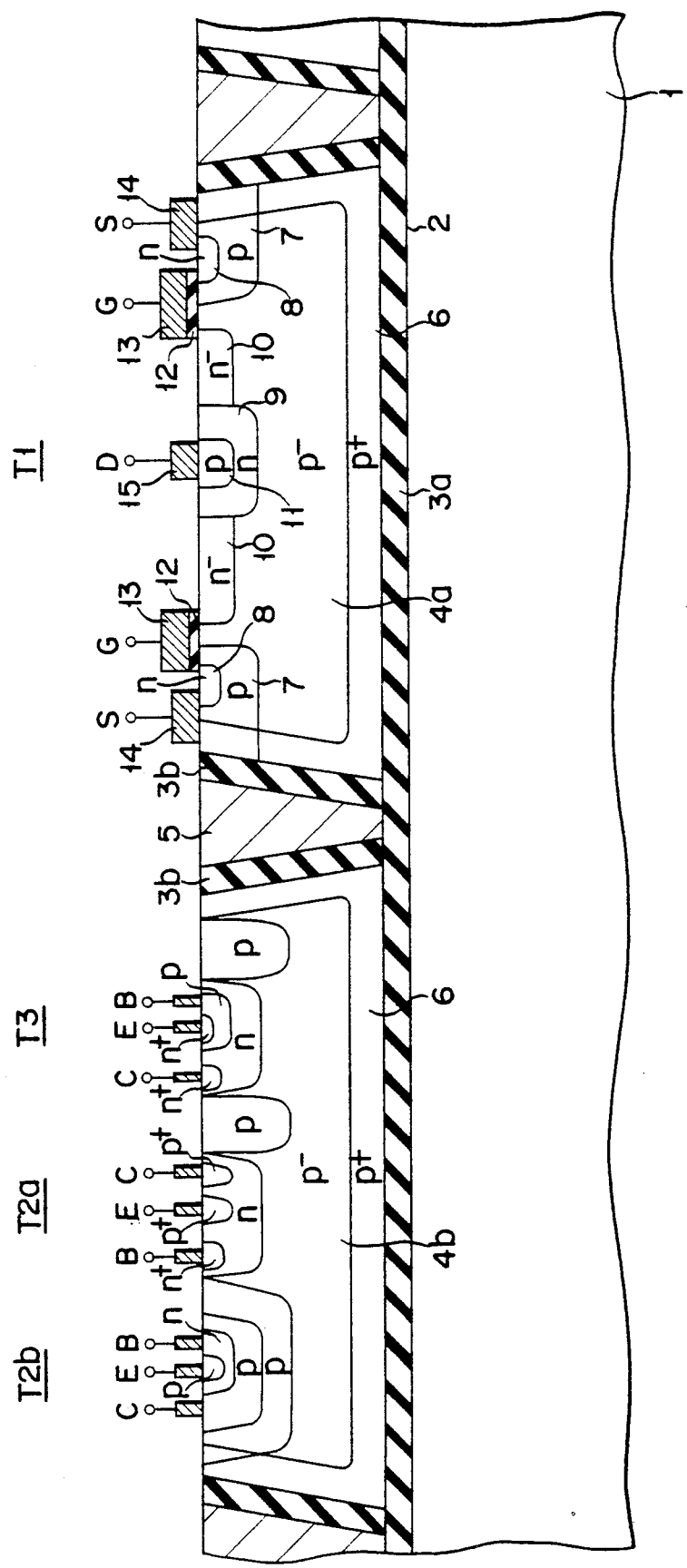

FIGS. 6 to 9 show embodiments wherein the arrangement of the bipolar transistor portions serving as low breakdown voltage elements is modified. In FIG. 6, $p^-$-type layer $4b$, n-type well 61, and p-type well are formed by impurity diffusion, and a collector, a base, and an emitter are sequentially formed in the respective wells by impurity diffusion, thereby forming pnp and npn transistors T2 and T3. In FIG. 7, n- and p-type wells 61 and 62 are formed by diffusion, and hence lateral type pnp and npn transistors T2 and T3 are respectively formed therein. In FIG. 8, p-type layer 81 is formed in p⁻-type layer 4b independently of p⁺-type layer 6 prior to substrate bonding so as to reduce the resistance. In FIG. 9, lateral type transistor T2a and vertical type transistor T2b are simultaneously integrated as pnp transistors.

In the embodiments shown in FIGS. 6 to 9, the same effects as in the previous embodiment can be obtained.

Figure 10:
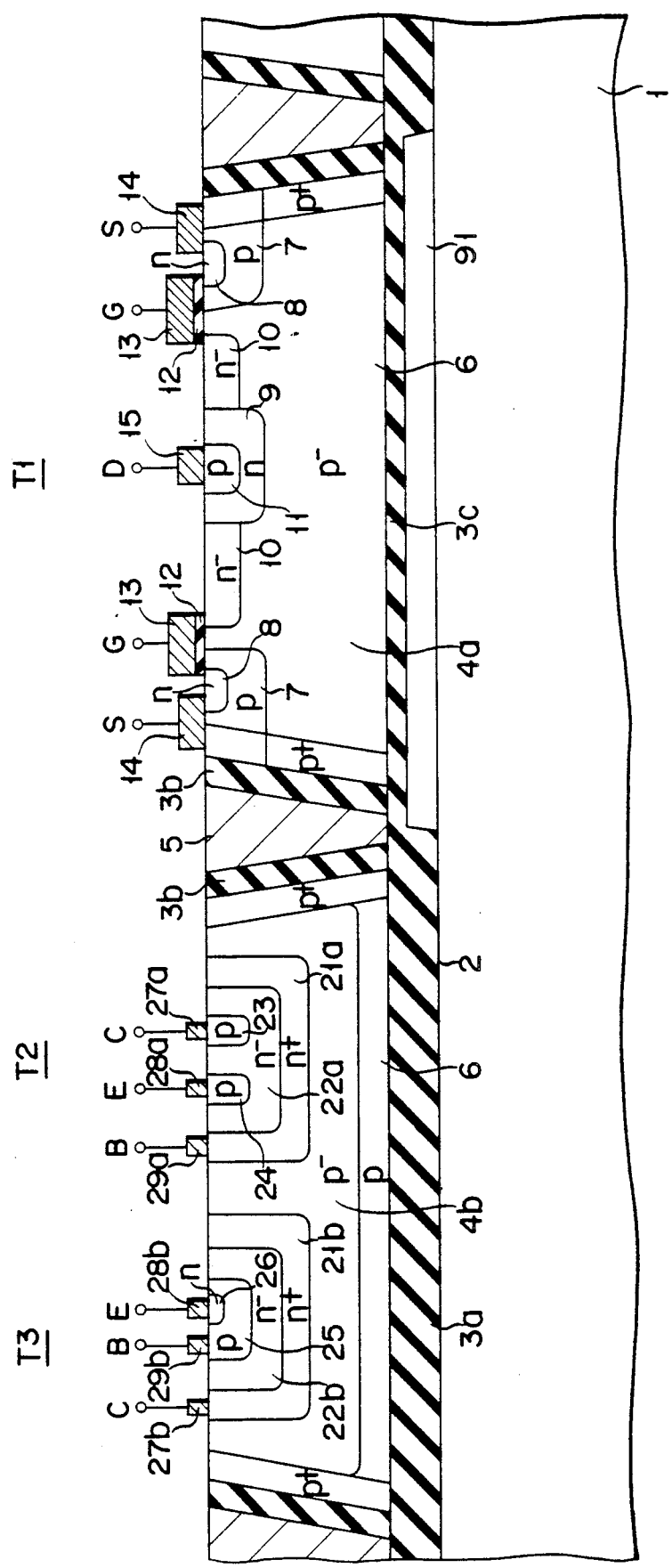
FIG. 10 is a sectional view of a semiconductor device in which a space is formed in a part of a bonding interface of a substrate.

FIG. 10 shows a structure of still another embodiment. In this embodiment, space 91 is formed at a position of bonding interface 2 below the IGBT-T1 region serving as the high breakdown voltage element in FIG. 1. This structure is obtained by forming oxide film 3a to a sufficient thickness by a process prior to bonding, etching oxide film 3a in the high breakdown voltage element region, forming thin oxide film 3c in the etched portion again, and performing bonding. With this structure, a breakdown voltage in a bottom portion of the high breakdown voltage element side can be further increased.

Figure 11:
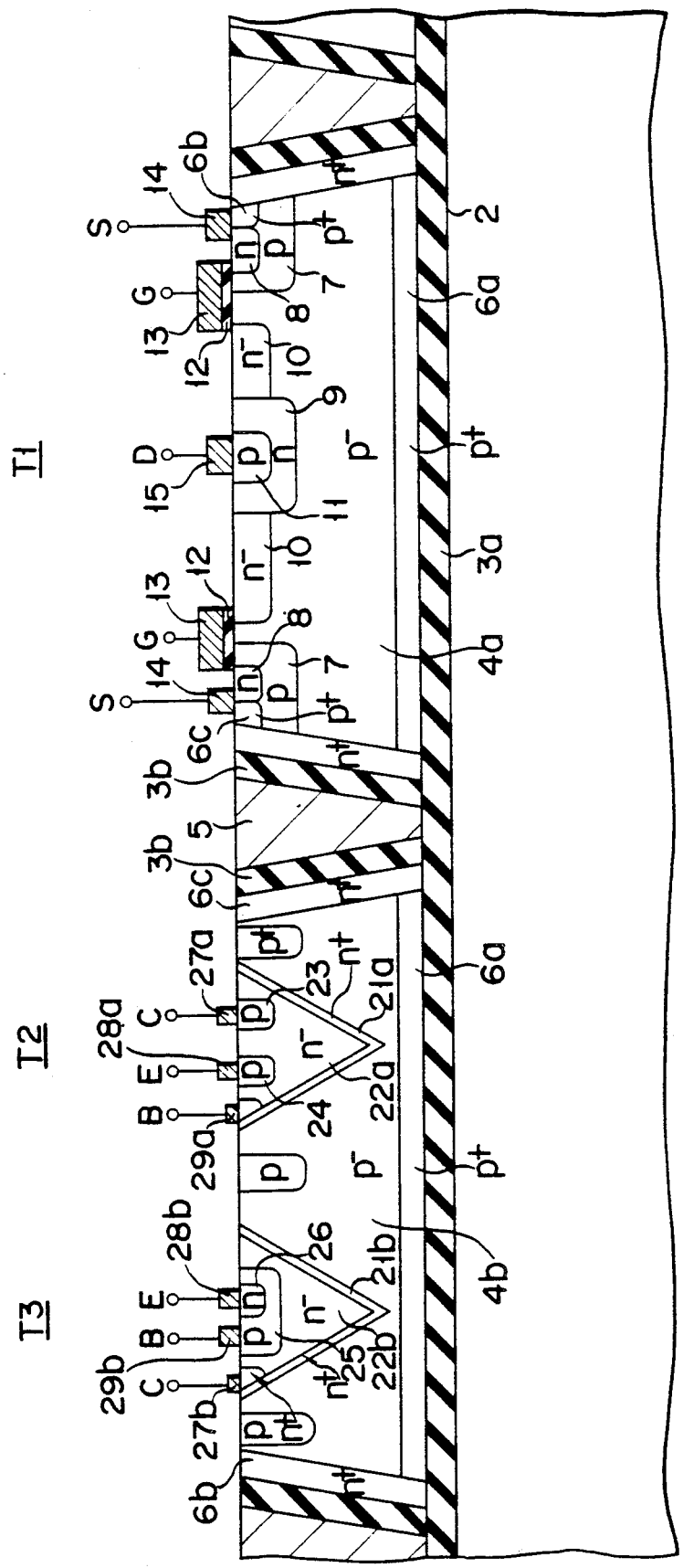
FIG. 11 is a sectional view of a semiconductor device in which a formation region of low breakdown voltage elements is formed simultaneously with formation of a trench for isolation.

FIG. 11 is a sectional view of a semiconductor device in which low breakdown voltage elements are formed in two wells having V-shaped sectional areas. In the above-described embodiments, the method of forming a trench and burying a semiconductor layer therein, and the method of impurity diffusion are described as methods of forming wells isolated by pn junction isolation. The method of forming trenches described with reference to FIGS. 2A to 2G is performed independently of the selective etching process for forming island Si layers by isolation. In this embodiment, however, trenches are formed in the wells simultaneously with the selective etching process for isolation of the island Si layers. The trenches for isolating/ forming the island layers must reach the bottom portions while the trenches in the well regions must not reach the bottom portions. Such conditions can be obtained by applying anisotropic etching capable of obtaining a predetermined taper angle to selective etching so as to select the size of an etching window.

Figure 12C:
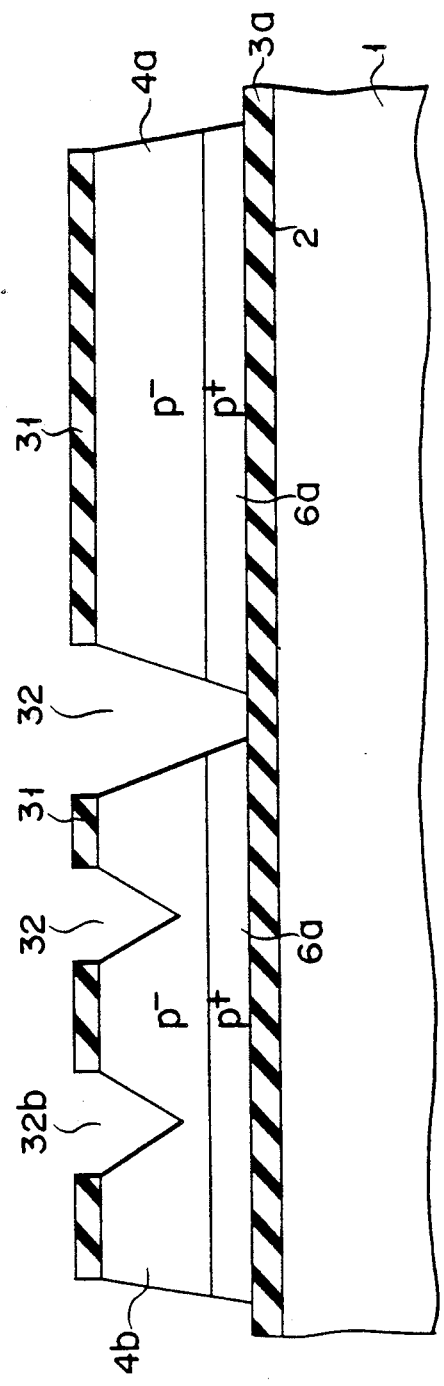
Figure 12D:
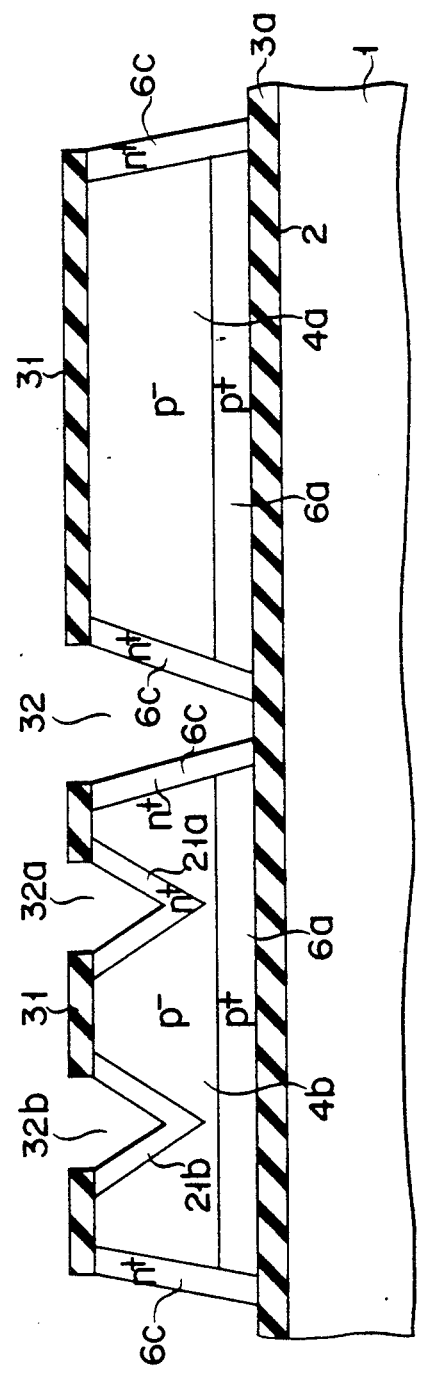
Figures 12E, 12F:
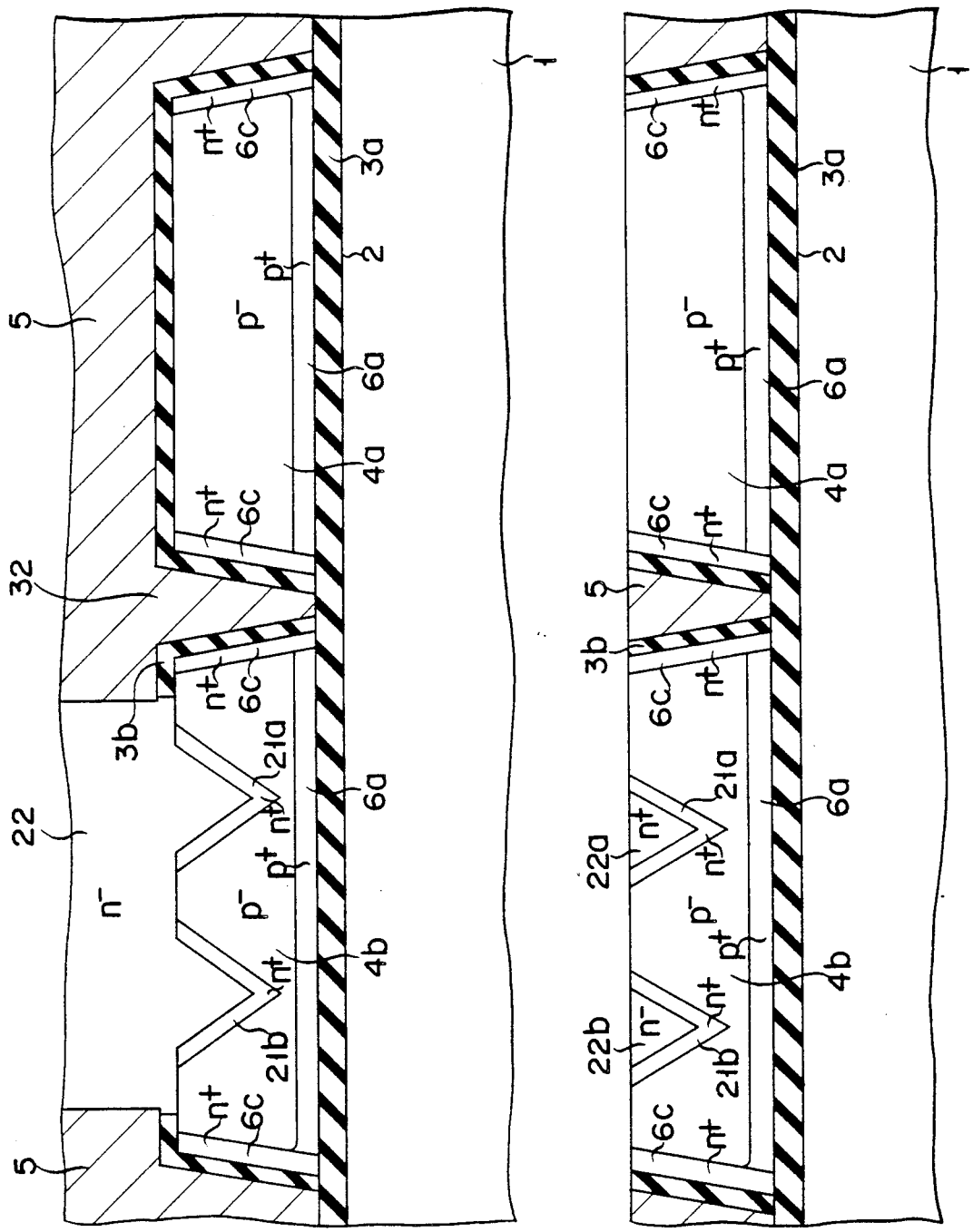
Figure 12G:
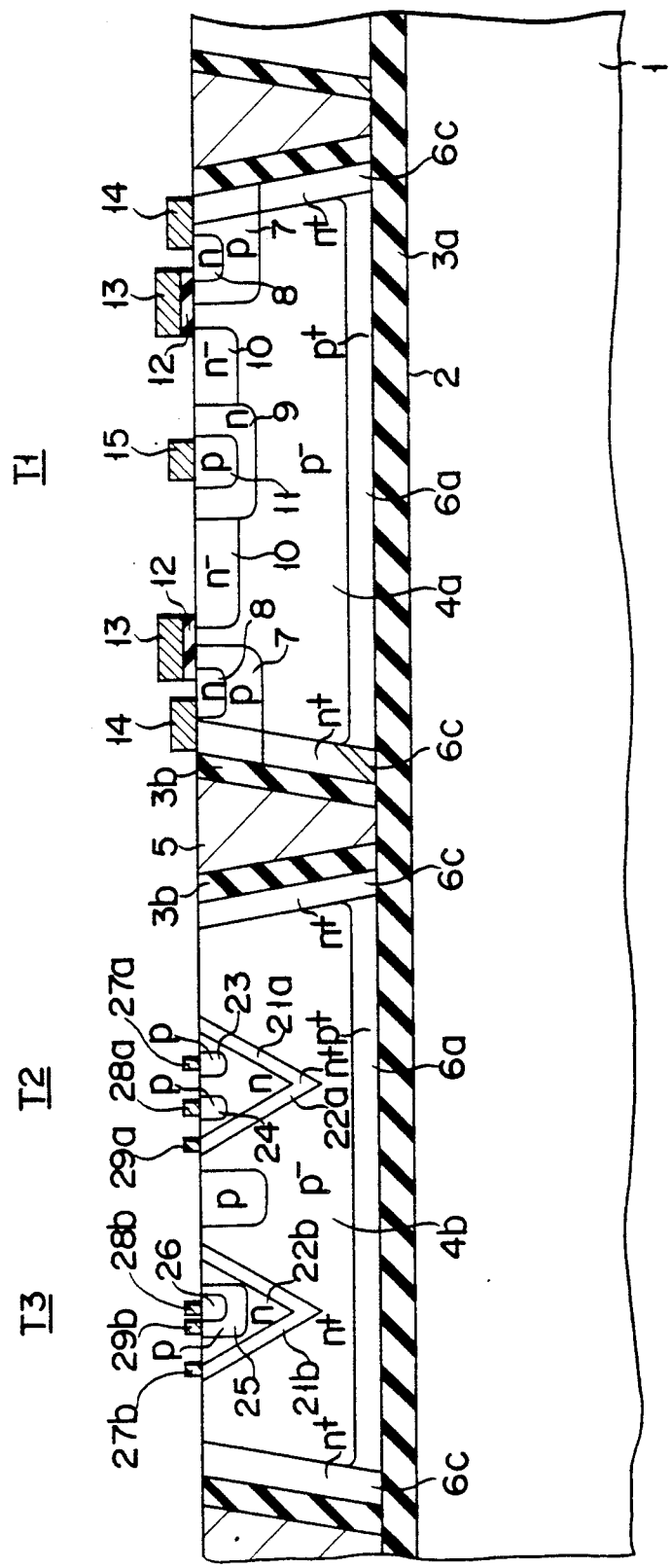

FIGS. 12A to 12G are sectional views showing the steps in manufacturing the semiconductor device in FIG. 11. The steps shown in FIGS. 12A and 12B are the same as those in FIGS. 2A and 2B. Si layer 4a on the high breakdown voltage element side and Si layer 4b on the low breakdown voltage element side are isolated from each other by forming isolation trench 32 by selective etching. At the same time, trenches 32a and 32b are formed in the well regions on the low breakdown voltage element side (FIG. 12C). By selecting the size of a window of SiO₂ upon anisotropic etching, trench 32 of the isolation region can be caused to reach the bottom portion while trenches 32a and 32b in the well regions do not reach the bottom portions. Thereafter, n⁺-type layers 6c, 21a, and 21b are formed in the side walls of trenches 32, 32a, and 32b upon diffusion of phosphorus or arsenic by epitaxial diffusion (FIG. 12D). Similar to the embodiment shown in FIGS. 2A to 2G, high-resistance n⁻-type Si layer 22 is formed by removing an oxide film on the low breakdown voltage element side and forming an Si layer by epitaxial growth. At the same time, polysilicon layer 5 is deposited on the high breakdown voltage element covered with the oxide film (FIG. 12E). Then, the grown layer is lapped, n⁻-type layers 22a and 22b serving as wells are buried in the respective recesses in Si layer 4, and polysilicon layer 5 is buried in the isolation trench (FIG. 12F). Thereafter, in an element forming process, IGBT-T1 is formed in Si layer 4a, and lateral type pnp transistor T2 and vertical type npn transistor T3 which are isolated from each other by a pn junction isolation are formed in Si layer 4b (FIG. 12G).

According to this embodiment, since isolation of the island Si layers and formation of the recesses in the well formation regions in the Si layers can be performed in a single etching process, the overall process can be simplified.

Figure 13:
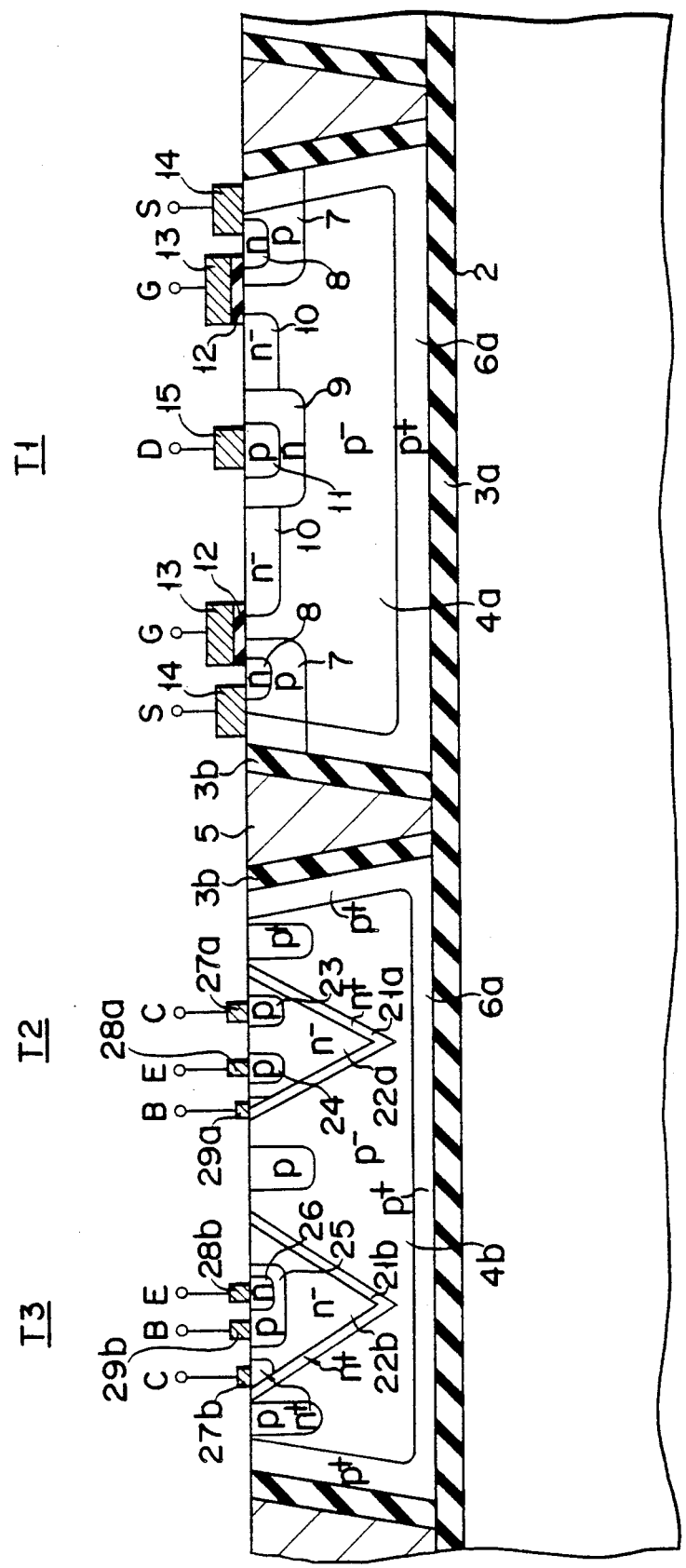
FIGS. 13 and 14 are sectional views of semiconductor devices as modifications of the device in FIG. 11.

FIG. 13 shows an embodiment wherein the structure in FIG. 11 is slightly modified. In FIG. 11, p⁺-type layers 6a are formed in the bottom portions of Si layers 4a and 4b, and n⁺-type layers 6c are formed on the side walls of the isolation trench simultaneously with formation of the n⁺-type layers on the side surfaces of the well region trenches. In this embodiment, however, the p⁺-type layers are formed on the bottom and side walls of the island Si layers.

Figure 14:
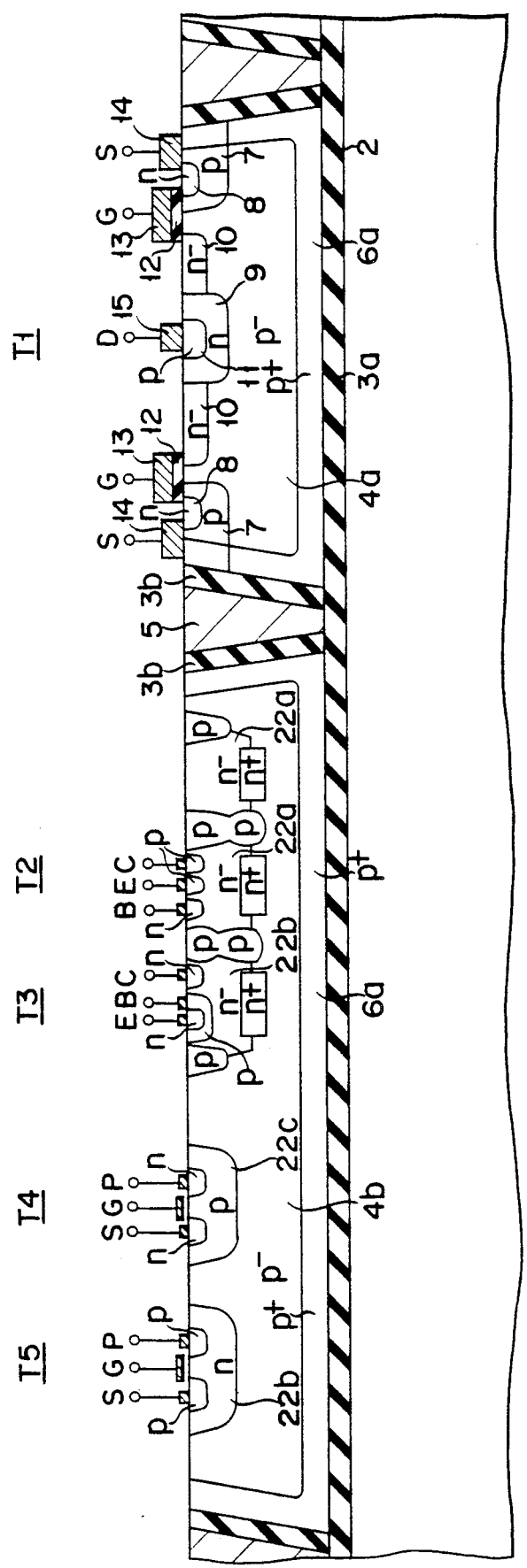

FIG. 14 shows a structure of still another embodiment. In this embodiment, n- and p-channel MOS transistors T4 and T5 constituting a CMOS circuit together with bipolar transistors T2 and T3 are formed in Si layer 4b on the low breakdown voltage element side. Bipolar transistors T2 and T3 are formed such that n⁻-type layer 22a formed by epitaxial growth is divided into a plurality of regions which are isolated from each other by a pn junction isolation, and transistors T2 and T3 are respectively formed in the regions. MOS transistors T4 and T5 are respectively formed in p- and n-type layers 22c and 22b formed by impurity diffusion.

In the embodiment shown in FIGS. 2A to 2G, and also the embodiment shown in FIGS. 12A to 12G, a p⁺-type layer and an n⁺-type layer are formed on the inner surface of trench 32 shown in FIGS. 2C and 12D, and SiO₂ film 31, which has been used as the mask, is then removed by means or etching. When SiO₂ film 31 is removed away, SiO₂ film 3a is inevitably etched away from the bottom of trench 32 as is shown in FIG. 15A. At the same time, the side etching of SiO₂ film 3a also proceeds. Thereafter, as is shown in FIG. 15B, SiO₂ film 3b is formed on the inner surface of trench 32 by means of thermal oxidation. The thickness of SiO₂ film 3a is determined by the breakdown voltage which is required of the interface between two Si substrates 1 and 4. On the other hand, the thickness of SiO₂ film 3b is determined by the breakdown voltage which is required of the interface between island-shaped Si layers 4a and 4b. The breakdown voltage required of the interface between two Si substrates 1 and 4 is equal, in most cases, to that required of the interface between island-shaped Si layers 4a and 4b. Nonetheless, SiO₂ film 3b is thinner than SiO₂ film 3a since it is this SiO₂ film 3b that isolates island-shaped Si layers 4a and 4b from each other.

Since SiO₂ film 3b is thinner than SiO₂ film 3a, SiO₂ film 3a is etched away from the bottom of trench 32 when SiO₂ film 31 is etched away. Consequently, SiO₂ film 3b formed on the bottom of trench 32 by thermal oxidation is thinner than SiO₂ film 3a. The side-etched portion of SiO₂ film 3a is particularly thin. SiO₂ film 3b formed on the bottom of trench 32, which is thin, is electrically weak, and fails to have a breakdown voltage as high as is desired.

This problem can be solved by making $SiO_2$ film 3b, that is formed on the inner surface of trench 32, thicker than $SiO_2$ film 3a formed between two Si substrates 1 and 4. In fact, when $SiO_2$ film 3b was made 1.5 $\mu$m thick, whereas $SiO_2$ film 3a was made 1 $\mu$m thick, as is shown in FIG. 15C, the breakdown voltage of the interface between Si substrates 1 and 4 was as high as 700 to 800 V. By contrast, when $SiO_2$ film 3b was made 0.8 $\mu$m thick, while $SiO_2$ film 3a was made 1 $\mu$m thick, the breakdown voltage of the interface between Si substrates 1 and 4 was only 500 V to 600 V.

As has been described above, according to the present invention, in an integrated circuit in which high and low breakdown voltage elements coexist, a dielectric isolation structure and a pn junction isolation structure are combined so that the integration density can be sufficiently increased while influences of noise and the like due to large current switching are effectively prevented.

What is claimed is:

1. A semiconductor device, comprising:
   a composite substrate formed by directly bonding a first semiconductor substrate serving as an element region to a second semiconductor substrate serving as a supporting member with a first insulating film interposed therebetween;
   a plurality of low breakdown voltage elements formed in said first semiconductor substrate; and
   a high breakdown voltage element formed in said first semiconductor substrate;
   said first semiconductor substrate being divided into first and second island regions which are isolated from each other by a dielectric material, said second island region including a plurality of element regions of a first conductivity type, each of the element regions being surrounded by second conductivity regions and isolated by a pn junction, said high breakdown voltage element being formed in said first island region, and said low breakdown voltage elements being formed in said second island region.

2. A device according to claim 1, wherein said first substrate of said composite substrate is divided into a first and second island regions which are isolated from each other by a second insulating film formed on an inner surface of a groove.

3. A device according to claim 2, wherein said second insulating film has a thickness larger than that of said first insulating film.

4. A device according to claim 2, wherein said high breakdown voltage element is formed in said first island region, said low breakdown voltage elements are formed in said second island region, and said low breakdown voltage elements are isolated from each other by a pn junction.

5. A device according to claim 4, wherein said second island region is of a first conductivity type, a first well of the first conductivity type and a second well of a second conductivity type are formed in said second island region, a lateral or vertical type bipolar transistor is formed in said first well, and a lateral or vertical type bipolar transistor having a conductivity type structure different from that of said lateral or vertical type bipolar transistor in said first well is formed in said second well.

6. A device according to claim 4, wherein said first and second wells have tapered side walls.

7. A device according to claim 4, wherein said second island region is of the first conductivity type, first well of the first conductivity type and a second well of the second conductivity type are formed in said second island region, a first MOS transistor is formed in said first well, and a second MOS transistor of a channel conductivity different from that of said first MOS transistor is formed in said second well.

8. A device according to claim 4, wherein said second island region is of the first conductivity type, a well of the second conductivity type is formed in said second island region, and a first bipolar transistor and a second bipolar transistor which is isolated from said first bipolar transistor by a pn junction are formed in said well.

9. A device according to claim 4, wherein no insulating film is present on a bonding interface between said first island region and said second substrate, and a vertical type device as a high breakdown voltage element is formed in said first island region.

10. A device according to claim 9, wherein said vertical type device is the one selected from the group consisting of a MOS transistor, MOS thyristor, insulated gate bipolar transistor, bipolar transistor, thyristor, gate turn-off thyristor, and MOS gate turn-off thyristor.

11. A device according to claim 4, wherein a space is formed in a bonding interface between said first island region and said second substrate.

12. A device according to claim 1, comprising said high breakdown voltage element and said low breakdown voltage elements being bipolar transistors.

13. A device according to claim 1, comprising a buried region of a first conductivity type formed in the bottom of said element region.

14. A device according to claim 1, comprising said buried region being an epitaxial layer.

15. A device according to claim 1, comprising an impurity region of a second conductivity type having an impurity concentration higher than that of said second conductivity region formed on said first insulating layer.

16. A device according to claim 2 comprising said groove being V-shaped and an upper width of the groove being larger than a lower width of the groove.

17. A semiconductor device, comprising:
   a composite substrate formed by directly bonding a first semiconductor substrate serving as an element region to a second semiconductor substrate serving as a supporting member with a first insulating film interposed therebetween;
   a plurality of low breakdown voltage bipolar transistor elements formed in said first semiconductor substrate; and
   a high breakdown voltage element formed in said first semiconductor substrate;
   said first semiconductor substrate being divided into first and second island regions which are isolated from each other by a second insulating layer formed on an inner surface of a V-shaped groove, said second island region including a plurality of element regions of a first conductivity type, each of the element regions being surrounded by second conductivity regions, said high breakdown voltage element being formed in said first island region, said low breakdown voltage bipolar transistor elements being formed in said second island region, a buried region of a first conductivity type being formed in the bottom of said element region, and an impurity region of a second conductivity type having an impurity concentration higher than that of said second conductivity regions being formed on said first insulating layer.

* * * * *